(12) United States Patent
Inaba

(10) Patent No.: US 7,046,546 B1
(45) Date of Patent: May 16, 2006

(54) SEMICONDUCTOR MEMORY DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/066,309

(22) Filed: Feb. 28, 2005

(30) Foreign Application Priority Data

Nov. 30, 2004 (JP) ............................. 2004-347682

(51) Int. Cl.
*G11C 11/00* (2006.01)
(52) U.S. Cl. ..................... 365/158; 365/171; 365/173
(58) Field of Classification Search ................ 365/158, 365/171, 173, 62

See application file for complete search history.

(56) References Cited

U.S. PATENT DOCUMENTS

| | | | |
|---|---|---|---|
| 5,956,267 | A | 9/1999 | Hurst et al. |
| 6,522,579 | B1 | 2/2003 | Hoenigschmid |
| 6,545,906 | B1 | 4/2003 | Savtchenko et al. |
| 6,590,803 | B1 | 7/2003 | Saito et al. |
| 6,900,490 | B1 * | 5/2005 | Asao et al. ................. 257/295 |
| 6,914,810 | B1 * | 7/2005 | Hosotani ..................... 365/173 |

OTHER PUBLICATIONS

Mark Durlam, et al. "A 1-Mbit MRAM Based on 1T1MTJ Bit Cell Integrated With Copper interconnects", IEEE Journal of Solid-State Circuits, vol. 38, No. 5, May 2003, pp. 769-773.
A. Bette, et al., "A High-Speed 128Kbit MRAM Core for Future Universal Memory Applications", 2003 Symposium on VLSI Circuits Digest of Technical Papers, Jun. 2003, 4 Pages.

* cited by examiner

*Primary Examiner*—Son T. Dinh
(74) *Attorney, Agent, or Firm*—Oblon, Spivak, McClelland, Maier & Neustadt, P.C.

(57) ABSTRACT

A semiconductor memory device includes a first write wiring which has first to third running portions, first and second oblique running portions, the first and second running portions running in a first direction, the third running portion running on substantially a same line as the first running portion, the first and second oblique running portions running in first and second oblique directions, a second write wiring which has fourth to sixth running portions, third and fourth oblique running portions, the fourth and fifth running portions running in a second direction, the sixth running portion running on substantially a same line as the fourth running portion, the third and fourth oblique running portions running in third and fourth oblique directions, and a memory element which is at least partially sandwiched between the first and third oblique running portions.

20 Claims, 24 Drawing Sheets

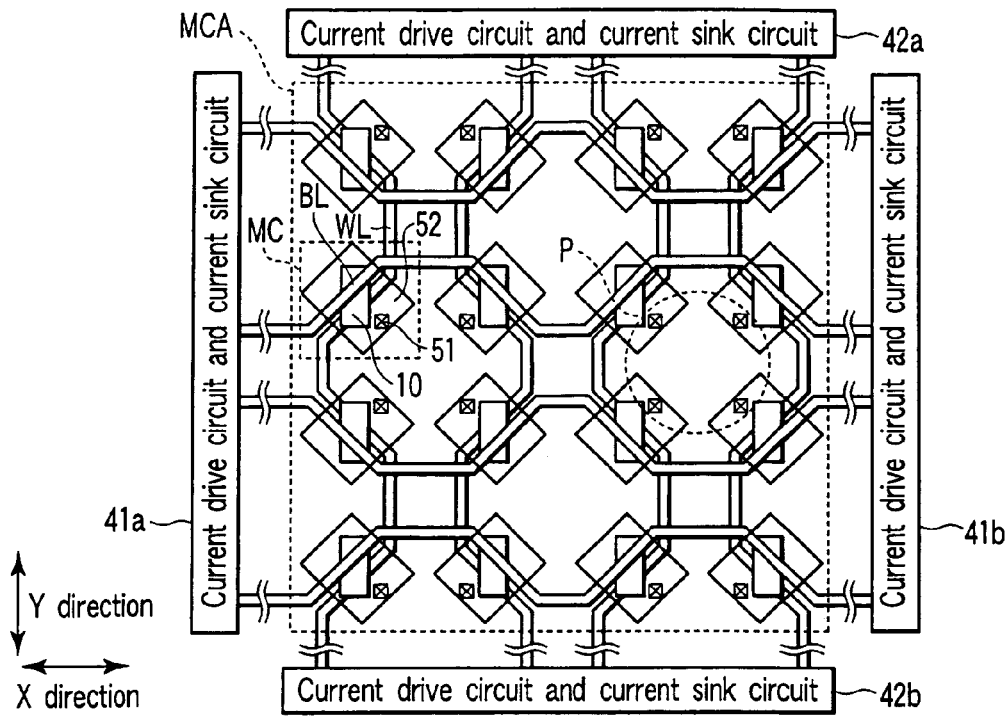
F I G. 21
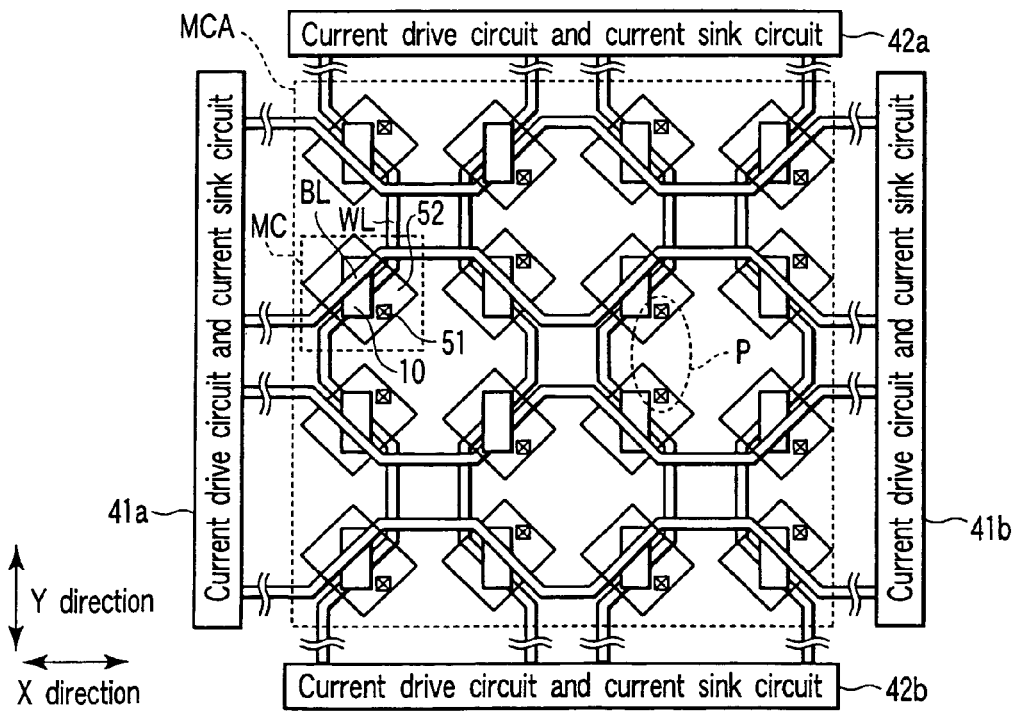
F I G. 22

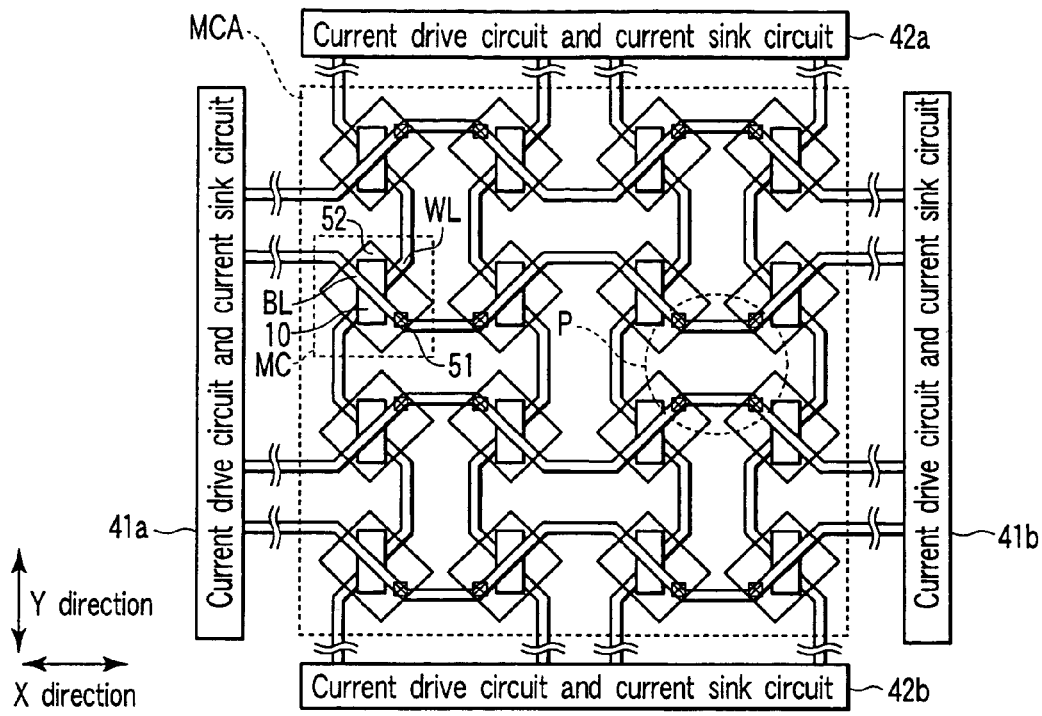
F I G. 31
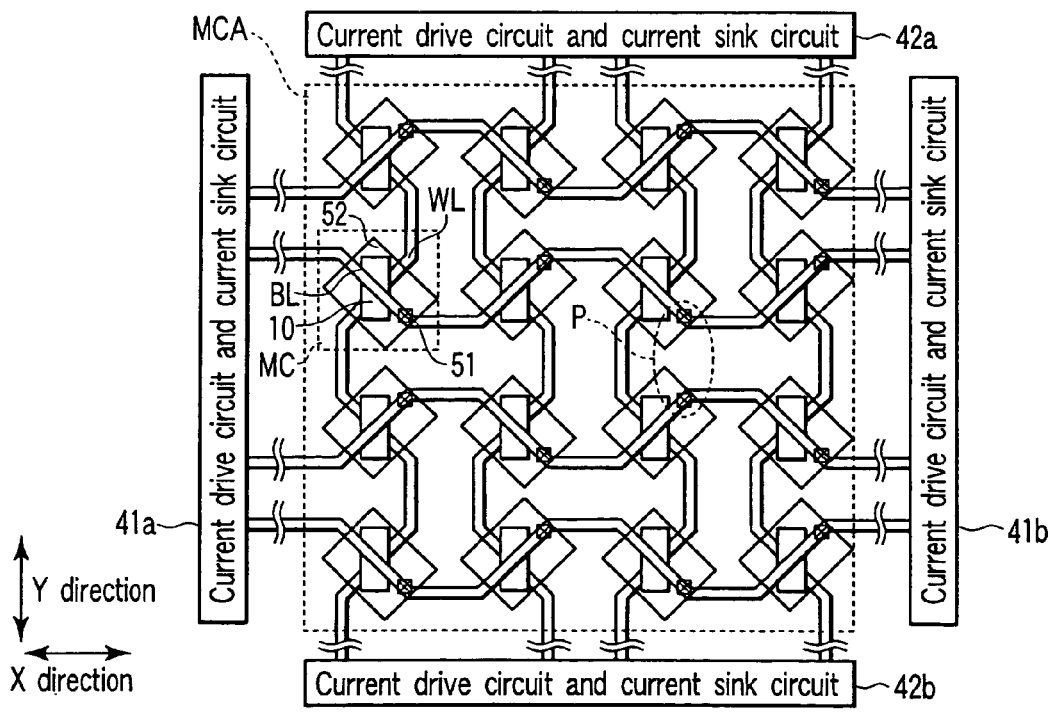
F I G. 32

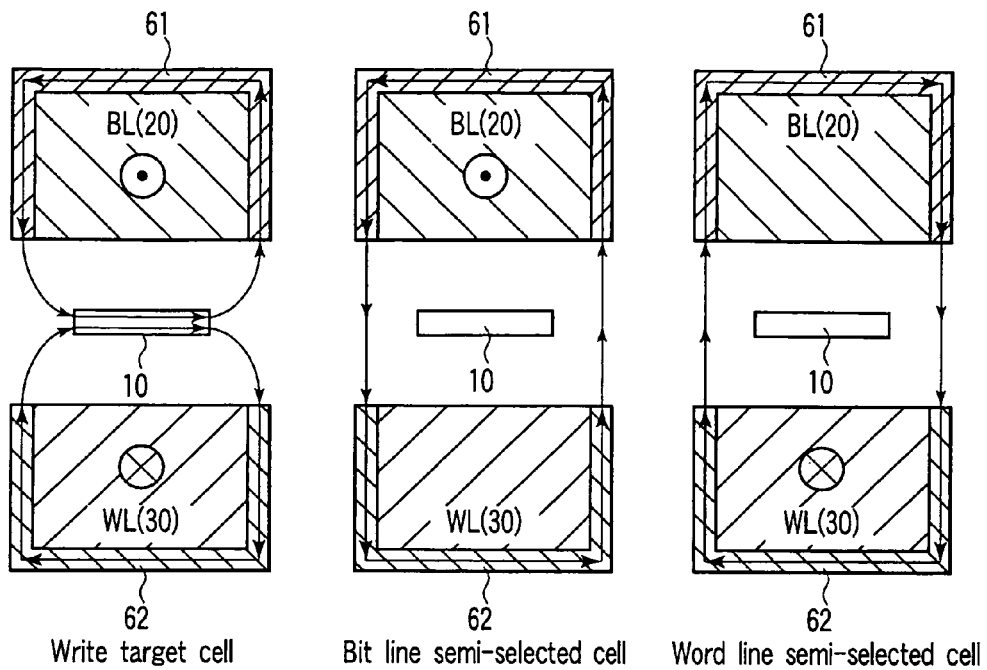
FIG. 40A Write target cell
FIG. 40B Bit line semi-selected cell
FIG. 40C Word line semi-selected cell
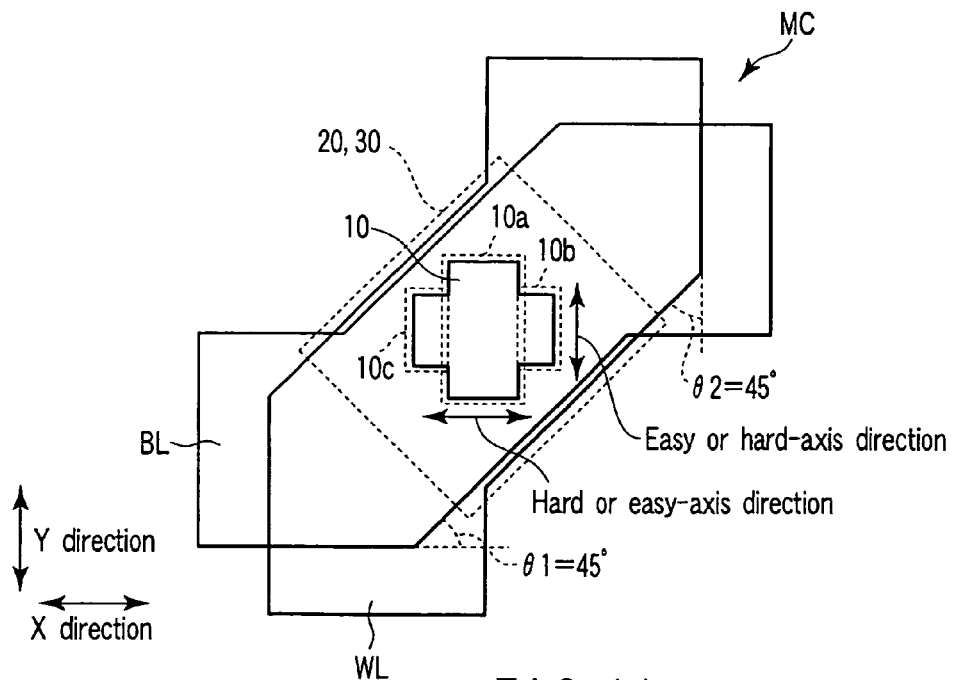
FIG. 41

US 7,046,546 B1

SEMICONDUCTOR MEMORY DEVICE

CROSS-REFERENCE TO RELATED APPLICATIONS

This application is based upon and claims the benefit of priority from prior Japanese Patent Application No. 2004-347682, filed Nov. 30, 2004, the entire contents of which are incorporated herein by reference.

BACKGROUND OF THE INVENTION

1. Field of the Invention

The present invention relates to a semiconductor memory device and, more particularly, to the layout structure and write operation of write wirings to write data in memory cells.

2. Description of the Related Art

An MRAM (Magnetic Random Access Memory) is a device which stores information by using a magnetoresistive effect. Since an MRAM has nonvolatility, high-speed operation, high integration, and high reliability, MRAMs are expected as memory devices capable of replacing a DRAM (Dynamic Random Access Memory) or EEPROM (Electrically Erasable and Programmable Read Only Memory), and development of MRAMs is progressing.

In an MTJ (Magnetic Tunnel Junction) element used in a memory cell of an MRAM, an insulating film is sandwiched between two ferromagnetic films. The MTJ element has the tunneling magnetoresistive effect. That is, the magnitude of a tunneling current changes between a parallel state in which the magnetization directions of the two ferromagnetic materials are parallel to each other and an anti-parallel state in which the magnetization directions are anti-parallel. When the magnetization directions are parallel, the resistance of the MTJ element is small because the tunneling current is large. When the magnetization directions are anti-parallel, the resistance of the MTJ element is large because the tunneling current is small. An MRAM stores binary information by defining, as "0" data, the state in which the resistance of the MTJ element is small and defining, as "1" data, the state in which the resistance of the MTJ element is large.

Presently, there are many challenges in implementing a large-capacity MRAM. Especially, how to reduce the write current is the largest challenge. When the write current is reduced, the power consumption of the MRAM can be reduced. In addition, since the write driver can be reduced, the chip size, i.e., the chip manufacturing cost can also be reduced.

In a conventional general MRAM (e.g., IEEE Journal of Solid-State Circuits, Vol. 38, No. 5, May 2003, pp. 769–773, and Transactions of Symposium on VLSI Circuits, pp. 217–220), the write is executed by using the synthetic field of two write fields generated by write currents which are supplied to a bit line and a word line laid out perpendicularly to each other. The MTJ element is laid out such that its axis of easy magnetization is directed in the same direction as that of the word line. The synthetic field is generated in the 45° direction with respect to the MTJ element. Hence, when the write fields by the bit line and word line have the same magnitude, the synthetic field is $\sqrt{2}$ times.

Methods to reduce the write current can roughly be classified into a method of reducing the switching field of the MTJ element by improving the characteristics of the magnetoresistive element itself and a method of more efficiently applying the write field generated by the write current to the MTJ element. As the latter method, for example, a method of shortening the distance between the write wiring and the MTJ element, a method of concentrating the flux by adding a so-called yoke structure around the write wiring (e.g., U.S. Pat. No. 5,956,267), and a method of decreasing the relative angle between the write fields generated by the bit line current and word line current to smaller than 90° to make the synthetic field larger than before (e.g., U.S. Pat. No. 6,522,579 and Jpn. Pat. Appln. KOKAI Publication No. 2002-289807) have been proposed.

In U.S. Pat. No. 6,522,579, the word line is laid out linearly in the direction of axis of easy magnetization of the MTJ element. The bit line is laid out obliquely with respect to the word line. The relative angle between the write field due to the bit line current and the write field due to the word line current is decreased to 90° or less, thereby making the synthetic field larger than before. In this method, however, since the bit line is laid out obliquely, the layout of a bit line driving circuit and the like is complex. For this reason, it is difficult to lay out cell portions.

On the other hand, in Jpn. Pat. Appln. KOKAI Publication No. 2002-289807, the bit line is laid out linearly in the direction of axis of hard magnetization of the MTJ element. The word line is laid out perpendicularly to the bit line as a whole wiring but is bent at right angles near the MTJ element so that the word line is parallel to the bit line. The word line current flows the shortest route at the right-angled portion near the MTJ element. For this reason, near the MTJ element, the word line current flows obliquely with respect to the layout direction of the word line. With this arrangement, the relative angle between the write field by the bit line current and the write field by the word line current is decreased to 90° or less to make the synthetic field larger than before while maintaining the conventional layout in which the whole bit line and word line run perpendicularly to each other, like before. However, since the bit line is laid out perpendicularly to the direction of axis of easy magnetization of the MTJ element, the direction of synthetic field is not 45° with respect to the easy-axis direction of the MTJ element. The portion with the smallest switching field in the asteroid curve of the MTJ element cannot be used.

BRIEF SUMMARY OF THE INVENTION

A semiconductor memory device according to an aspect of the present invention comprises a first write wiring which has a first running portion, a second running portion, a third running portion, a first oblique running portion, and a second oblique running portion, the first running portion running in a first direction, the second running portion running in the first direction, the third running portion running on substantially a same line as the first running portion, the first oblique running portion running in a first oblique direction with respect to the first direction, the second oblique running portion running in a second oblique direction different from the first oblique direction, the first oblique running portion having one end connected to the first running portion and the other end connected to one end of the second running portion, and the second oblique running portion having one end connected to the other end of the second running portion and the other end connected to the third running portion; a second write wiring which has a fourth running portion, a fifth running portion, a sixth running portion, a third oblique running portion, and a fourth oblique running portion, the fourth running portion running in a second direction different from the first direction, the fifth running portion running in the second direction, the sixth running portion running on substantially a same line as the fourth running portion, the third oblique running portion running in a third oblique direction with respect to the second direction, the fourth oblique running portion running in a fourth oblique direction different from the third oblique direction, the third oblique running portion having one end connected to the fourth running portion and the other end connected to one end of the fifth running portion, and the fourth oblique running portion having one end connected to the other end of the fifth running portion and the other end connected to the sixth running portion; and a memory element which is at least partially sandwiched between the first oblique running portion and the third oblique running portion.

BRIEF DESCRIPTION OF THE SEVERAL VIEWS OF THE DRAWING

FIGS. 21 to 24 are views showing layouts of the memory cell array of the magnetic random access memory according to the eighth embodiment of the present invention;

FIGS. 31 to 34 are views showing layouts of the memory cell array of the magnetic random access memory according to the tenth embodiment of the present invention;

FIG. 40A is a sectional view of a write target cell, which shows a memory cell having a yoke structure in the magnetic random access memory according to the eleventh embodiment of the present invention;

FIG. 40B is a sectional view of a bit-line semi-selected cell, which shows a memory cell having a yoke structure in the magnetic random access memory according to the eleventh embodiment of the present invention;

FIG. 40C is a sectional view of a word-line semi-selected cell, which shows a memory cell having a yoke structure in the magnetic random access memory according to the eleventh embodiment of the present invention; and FIG. 41 is a plan view showing the layout of a memory cell of a magnetic random access memory according to a twelfth embodiment of the present invention.

DETAILED DESCRIPTION OF THE INVENTION

Figure 1A:
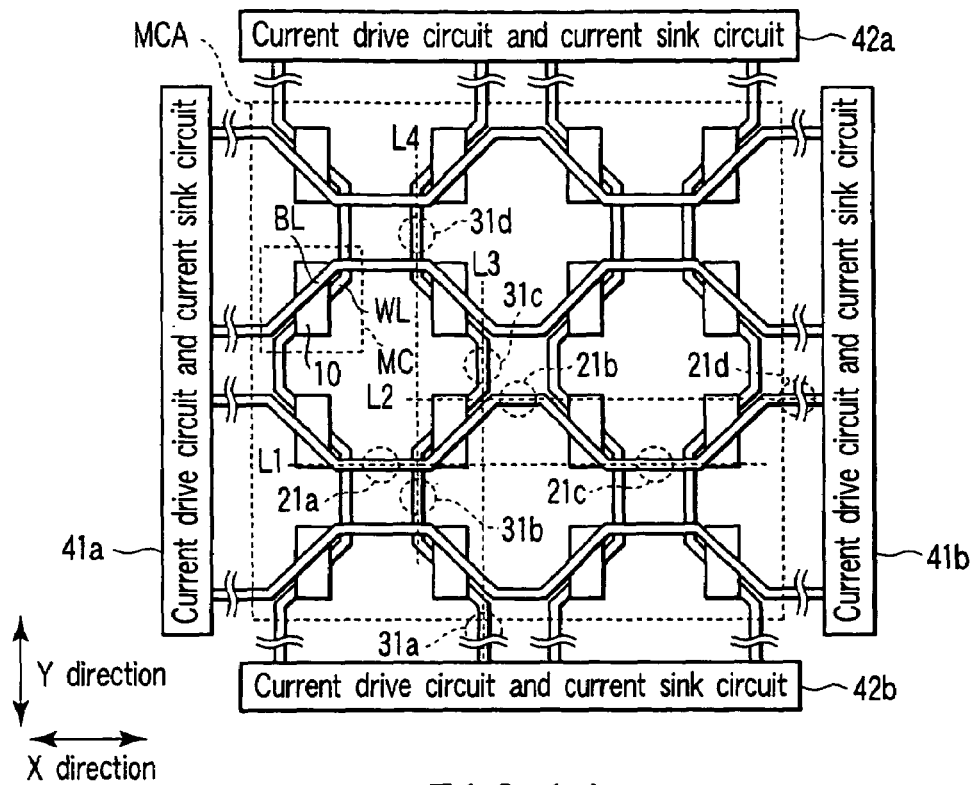
FIG. 1A is a schematic view of a memory cell array, which shows the cell layout of a magnetic random access memory according to a first embodiment of the present invention.

The embodiments of the present invention will be described below with reference to the accompanying drawing. The same reference numerals denote the same parts throughout the drawing.

In the description of the embodiments of the present invention, an MRAM (Magnetic Random Access Memory) will be exemplified as a semiconductor memory device. An MTJ (Magnetic Tunnel Junction) element will be exemplified as the memory element of the magnetic random access memory. However, the present invention is not limited to this and can also be applied to another semiconductor memory.

First Embodiment

In the first embodiment, the bit line and word line run in the X and Y directions in a zigzag pattern. Near the MTJ element, the bit line and word line run in the same oblique direction. In addition, the direction of axis of easy magnetization or the direction of axis of hard magnetization of the MTJ element is tilted by 45° with respect to the oblique direction.

Figure 1B:
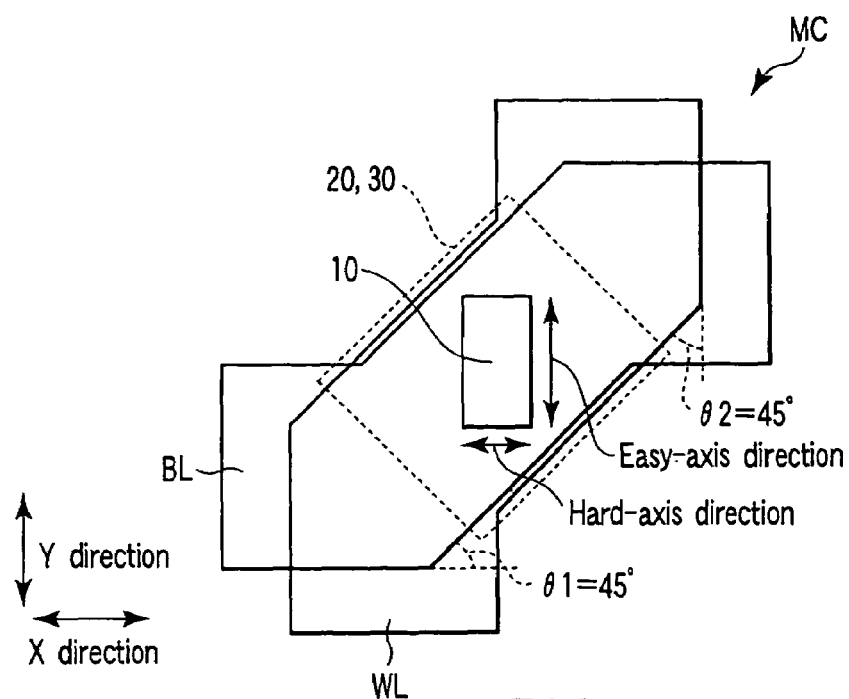
FIG. 1B is a plan view of a memory cell, which shows the cell layout of the magnetic random access memory according to the first embodiment of the present invention.

FIGS. 1A and 1B are views showing the cell layout of a magnetic random access memory according to the first embodiment of the present invention. The layout of the write wirings of the magnetic random access memory according to the first embodiment will be described below.

As shown in FIG. 1A, in a memory cell array MCA, a plurality of bit lines BL functioning as write wirings run in the X direction in a zigzag pattern. A plurality of word lines WL functioning as write wirings run in the Y direction (e.g., in a direction perpendicular to the X direction) in a zigzag pattern. MTJ elements 10 serving as magnetoresistive elements are laid out between the bit lines BL and the word lines WL. Adjacent bit lines BL are laid out line-symmetrically in the X direction. Adjacent word lines WL are laid out line-symmetrically in the Y direction. Around the memory cell array MCA, current drive circuits and current sink circuits 41a and 41b serving as write circuits are arranged at the ends of the bit lines BL. Current drive circuits and current sink circuits 42a and 42b serving as write circuits are arranged at the ends of the word lines WL. With this structure, currents can be supplied to the bit lines BL and word lines WL in both directions.

As shown in FIG. 1B, in one memory cell MC, the direction of axis of easy magnetization of the MTJ element 10 is directed in the Y direction in which the word line WL runs, and the direction of axis of hard magnetization of the MTJ element 10 is directed in the X direction in which the bit line BL runs. The bit line BL has, near the MTJ element 10, an oblique running portion 20 which runs obliquely with respect to the direction of axis of hard magnetization. The word line WL has, near the MTJ element 10, an oblique running portion 30 which runs obliquely with respect to the direction of axis of easy magnetization. A tilt angle θ1 of the oblique running portion 20 of the bit line BL with respect to the direction of axis of hard magnetization (X direction) is 45°. A tilt angle θ2 of the oblique running portion 30 of the word line WL with respect to the direction of axis of easy magnetization (Y direction) is 45°.

The oblique running portions 20 and 30 of the bit line BL and word line WL run in parallel in the same direction and overlap when viewed from the upper side. That is, the relative angle between the running direction of the oblique running portion 20 of the bit line BL and that of the oblique running portion 30 of the word line WL is 0°. In other words, the relative angle between the direction of a magnetic field generated from a write current which flows to the oblique running portion 20 of the bit line BL and the direction of a magnetic field generated from a write current which flows to the oblique running portion 30 of the word line WL is 0°. The oblique running portions 20 and 30 of the bit line BL and word line WL are shifted in FIG. 1B for illustrative convenience. Actually, they overlap each other, as described above.

In the memory cell array MCA, the plurality of bit lines BL and word lines WL are arranged. The oblique running portions 20 of the adjacent bit lines BL run in opposite directions (symmetrical directions), i.e., are directed in directions shifted by almost 90°. The oblique running portions 30 of the adjacent word lines WL run in opposite directions (symmetrical directions), i.e., are directed in directions shifted by almost 90°.

The relative angle between the X direction and the running direction of an arbitrary oblique running portion 20 equals the relative angle between the X direction and the running direction of the oblique running portion 20 adjacent to the arbitrary oblique running portion 20. The relative angle between the Y direction and the running direction of an arbitrary oblique running portion 30 equals the relative angle between the Y direction and the running direction of the oblique running portion 30 adjacent to the arbitrary oblique running portion 30.

As shown in FIG. 1A, of linear portions 21a, 21b, 21c, and 21d of the bit line BL, which run in the X direction, the linear portions 21a and 21c are located almost on the same line L1, and the linear portions 21b and 21d are located almost on the same line L2. Similarly, as shown in FIG. 1A, of linear portions 31a, 31b, 31c, and 31d of the word line WL, which run in the Y direction, the linear portions 31a and 31c are located almost on the same line L3, and the linear portions 31b and 31d are located almost on the same line L4.

The vertical positional relationship between the bit line BL and the word line WL is not particularly limited. More specifically, the bit line BL may be arranged above the MTJ element 10, and the word line WL may be arranged under the MTJ element 10. The word line WL may be arranged above the MTJ element 10, and the bit line BL may be arranged under the MTJ element 10. The wiring width of the bit line BL and that of the word line WL may be the same or different.

It is only necessary that at least part of the MTJ element 10 is sandwiched between the oblique running portions 20 and 30 in the direction perpendicular to their film surfaces. More specifically, the MTJ element 10 may be larger than the wiring widths of the running portions 20 and 30 of the bit line BL and word line WL (e.g., FIG. 1A) or smaller than the wiring widths of the running portions 20 and 30 of the bit line BL and word line WL (e.g., FIG. 1B).

Figure 2A:
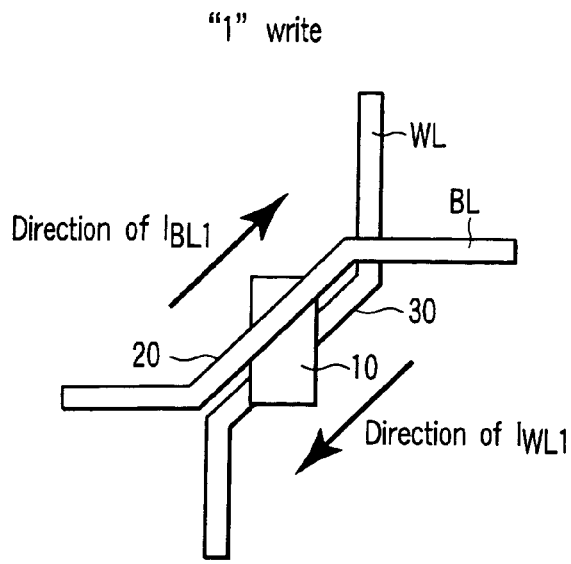
FIG. 2A is a view showing the directions of write currents in writing "1" data in the magnetic random access memory according to the first embodiment of the present invention.
Figure 2B:
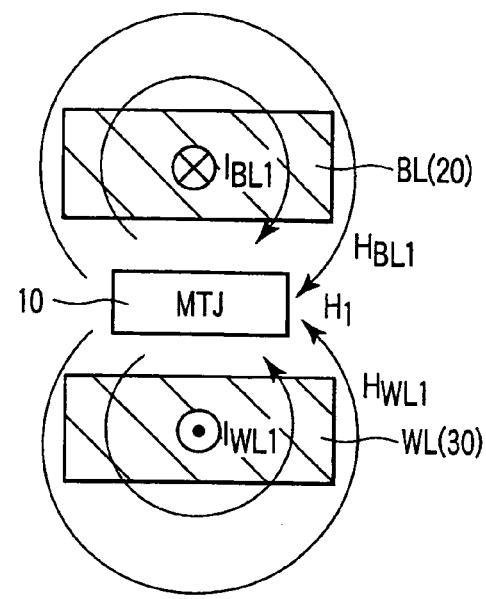
FIG. 2B is a view showing write fields in writing "1" data in the magnetic random access memory according to the first embodiment of the present invention.
Figure 3A:
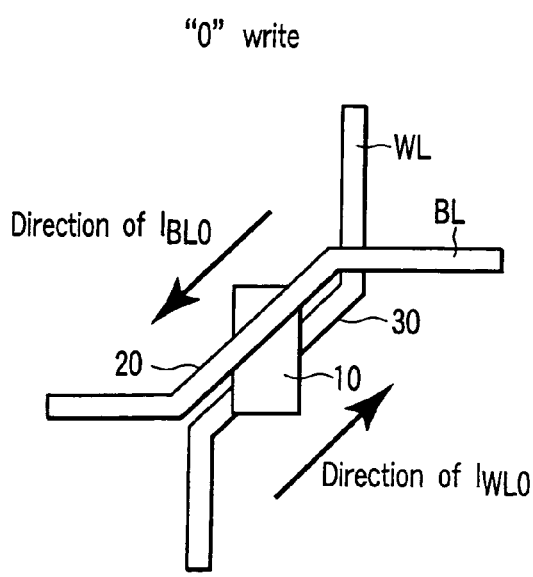
FIG. 3A is a view showing the directions of write currents in writing "0" data in the magnetic random access memory according to the first embodiment of the present invention.
Figure 3B:
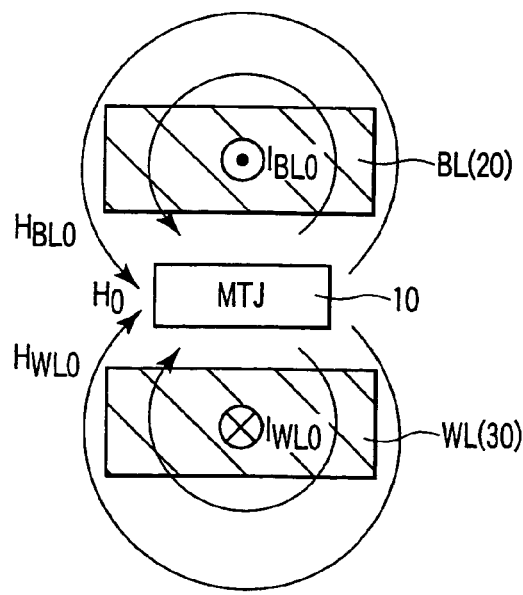
FIG. 3B is a view showing write fields in writing "0" data in the magnetic random access memory according to the first embodiment of the present invention.

FIGS. 2A and 2B show a "1"-data write in the magnetic random access memory according to the first embodiment of the present invention. FIGS. 3A and 3B show a "0"-data write in the magnetic random access memory according to the first embodiment of the present invention. The data write according to the first embodiment will be described below.

The following current magnetic field write method is employed to write data in the MTJ element 10. Write currents $I_{BL}$ and $I_{WL}$ are supplied to the bit line BL and word line WL, respectively. A synthetic field H of magnetic fields $H_{BL}$ and $H_{WL}$ generated from the write currents $I_{BL}$ and $I_{WL}$ is applied to the MTJ element 10. Accordingly, the magnetization in the MTJ element 10 is set in the parallel state or anti-parallel state so that binary data "1" or "0" can be written. More specifically, the write according to the first embodiment is executed in the following way.

To write "1" data, as shown in FIG. 2A, a write current $I_{BL1}$ is supplied to the oblique running portion 20 of the bit line BL obliquely toward the upper right of the drawing surface. A write current $I_{WL1}$ is supplied to the oblique running portion 30 of the word line WL obliquely toward the lower left of the drawing surface. Accordingly, as shown in FIG. 2B, a synthetic field $H_1$ of magnetic fields $H_{BL1}$ and $H_{WL1}$ generated from the write currents $I_{BL1}$ and $I_{WL1}$ can be applied to the MTJ element 10 from one direction.

To write "0" data, as shown in FIG. 3A, a write current $I_{BL0}$ is supplied to the oblique running portion 20 of the bit line BL obliquely toward the lower left of the drawing surface. A write current $I_{WL0}$ is supplied to the oblique running portion 30 of the word line WL obliquely toward the upper right of the drawing surface. Accordingly, as shown in FIG. 3B, a synthetic field $H_0$ of magnetic fields $H_{BL0}$ and $H_{WL0}$ generated from the write currents $I_{BL0}$ and $I_{WL0}$ can be applied to the MTJ element 10 from one direction.

As described above, in the first embodiment, to write arbitrary n (n=1 or 0) data, a write current $I_{BLn}$ to be supplied to the oblique running portion 20 of the bit line BL and a write current $I_{WLn}$ to be supplied to the oblique running portion 30 of the word line WL are supplied in opposite directions. In addition, the write current $I_{BL1}$ in the "1" data write and the write current $I_{BL0}$ in the "0" data write are supplied in opposite directions. Similarly, the write current $I_{WL1}$ in the "1" data write and the write current $I_{WL0}$ in the "0" data write are supplied in opposite directions.

Figure 4:
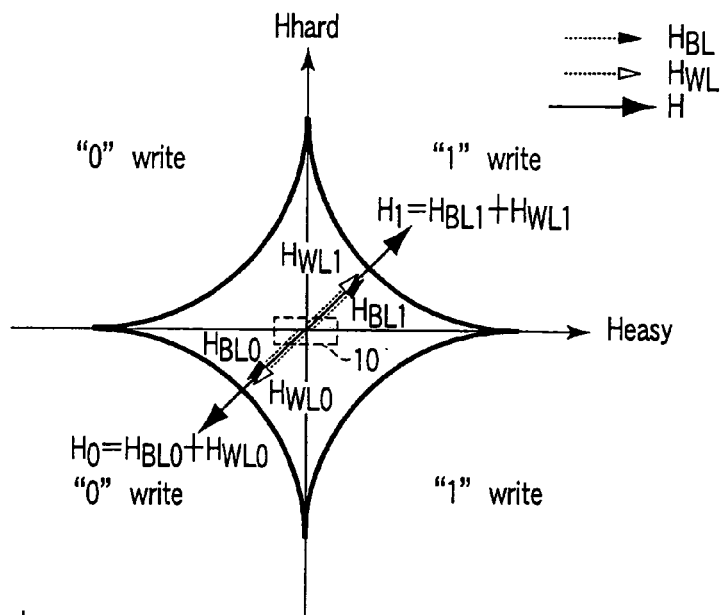
FIG. 4 is a view showing the asteroid curve of the magnetic random access memory according to the first embodiment of the present invention.

FIG. 4 shows the asteroid curve of the magnetic random access memory according to the first embodiment of the present invention. The data write according to the first embodiment will be described below in more detail by using the asteroid curve.

As shown in FIG. 4, in the "1" data write, the magnetic fields $H_{BL1}$ and $H_{WL1}$ generated from the write currents $I_{BL1}$ and $I_{WL1}$ are generated in a direction tilted by 45° with respect to the direction of axis of easy magnetization or the direction of axis of hard magnetization. For this reason, the magnetic fields $H_{BL1}$ and $H_{WL1}$ are generated in the same direction. The synthetic field $H_1$ of the magnetic fields $H_{BL1}$ and $H_{WL1}$ is given by $H_{BL1}+H_{WL1}$. Similarly, in the "0" data write, the magnetic fields $H_{BL0}$ and $H_{WL0}$ generated from the write currents $I_{BL0}$ and $I_{WL0}$ are generated in a direction tilted by 45° with respect to the direction of axis of easy magnetization or the direction of axis of hard magnetization. For this reason, the magnetic fields $H_{BL0}$ and $H_{WL0}$ are generated in the same direction. The synthetic field Ho of the magnetic fields $H_{BL0}$ and $H_{WL0}$ is given by $H_{BL0}+H_{WL0}$.

The magnitude of the write current $I_{BL1}$ supplied to the bit line BL in the "1" data write can be equal to or different from that of the write current $I_{BL0}$ supplied to the bit line BL in the "0" data write. The magnitude of the write current $I_{WL1}$ supplied to the word line WL in the "1" data write can be equal to or different from that of the write current $I_{WL0}$ supplied to the word line WL in the "0" data write.

In the "1" data write, the magnitude of the write current $I_{BL1}$ supplied to the bit line BL can be equal to or different from that of the write current $I_{WL1}$ supplied to the word line WL. In the "0" data write, the magnitude of the write current $I_{BL0}$ supplied to the bit line BL can be equal to or different from that of the write current $I_{WL0}$ supplied to the word line WL.

The above-described "1" data write can be changed to the "0" data write, and the above-described "0" data write can be changed to the "1" data write.

Figure 5A:
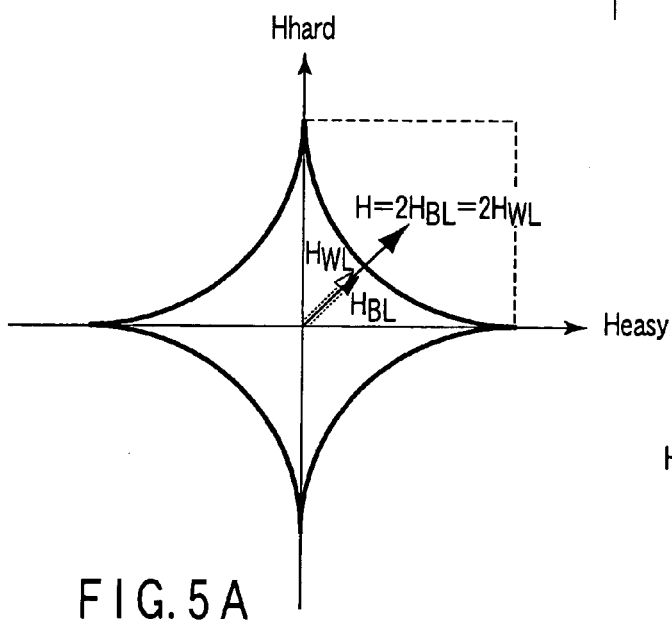
FIG. 5A is a view showing the asteroid curve of the magnetic random access memory according to the first embodiment of the present invention.
Figure 5B:
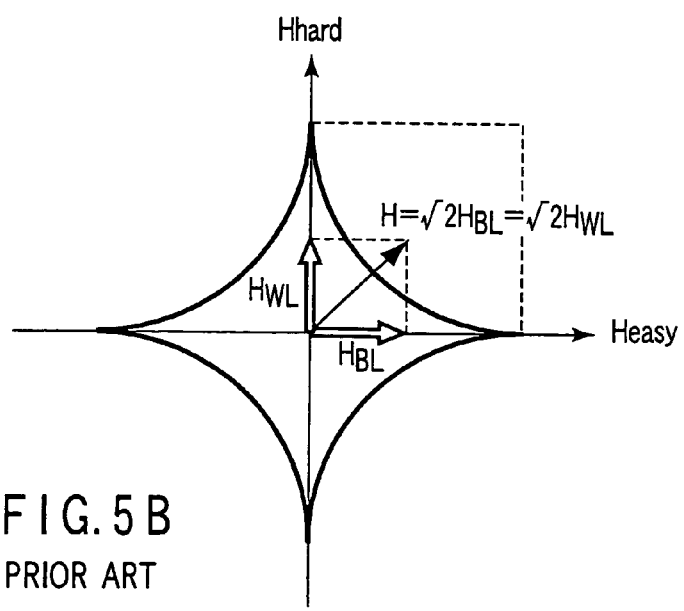
FIG. 5B is a view showing the asteroid curve of a magnetic random access memory according to a prior art.

In the first embodiment, the bit line BL and word line WL run in a zigzag pattern. The relative angle between the running directions of the oblique running portions 20 and 30 of the bit line BL and word line WL is smaller than 90° near the MTJ element 10. That is, the bit line BL has the oblique running portion 20 which is tilted by 45° with respect to the direction of axis of hard magnetization of the MTJ element 10. The word line WL has the oblique running portion 30 which is tilted by 45° with respect to the direction of axis of easy magnetization of the MTJ element. The oblique running portions 20 and 30 run in the same direction while overlapping each other. With this structure, the magnetic fields $H_{BL}$ and $H_{WL}$ generated by the write currents $I_{BL}$ and $I_{WL}$ which flow to the bit line BL and word line WL are directed in the same direction. When the magnetic fields $H_{BL}$ and $H_{WL}$ have the same magnitude, the synthetic field H of the magnetic fields $H_{BL}$ and $H_{WL}$ is defined as twice of each of the magnetic fields $H_{BL}$ and $H_{WL}$ (FIG. 5A). In the conventional structure, the synthetic field H is $\sqrt{2}$ times of each of the magnetic fields $H_{BL}$ and $H_{WL}$ by the bit line BL and word line WL (FIG. 5B). According to the first embodiment, since the write field generation efficiency can be increased, the write current can be reduced to $1/\sqrt{2}$, as compared to the prior art.

The bit lines BL and word lines WL run in a zigzag pattern in the memory cell array MCA. However, they run in the X and Y directions over the whole memory cell array MCA. Since the current drive circuits (current drive circuits and current sink circuits 41a, 41b, 42a, and 42b) and the like can be laid out in the same pattern as before, a simple layout can be implemented.

The bit lines BL and word lines WL are laid out in a zigzag pattern. Adjacent wirings are laid out line-symmetrically with respect to the direction in which they are extended. With this structure, the wiring length of the bit line BL can equal that of the word line WL. Since the current driving capability of the write drive circuit for the bit line BL can equal that for word line WL, the narrow channel effect of the transistors need not be taken into consideration in adjusting the current driving capability.

Figure 6:
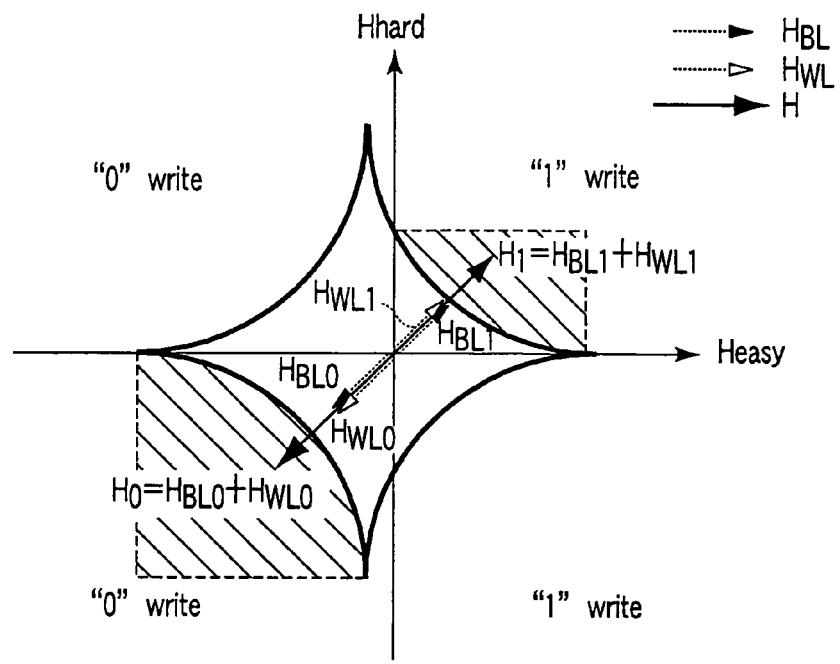
FIG. 6 is a view showing the asteroid curve of the magnetic random access memory according to the first embodiment of the present invention when a shift has occurred.

The magnetic fields $H_{BL}$ and $H_{WL}$ by the write currents $I_{BL}$ and $I_{WL}$ flowing to the bit line BL and word line WL are generated in directions different from the direction of axis of hard magnetization or direction of axis of easy magnetization of the MTJ element 10. To write "1" data, a current value which generates a magnetic field in, e.g., the first quadrant of the asteroid curve is used. To write "0" data, a current value which generates a magnetic field in, e.g., the third quadrant of the asteroid curve is used. Accordingly, the write current value in the "1" data write can be made different from the write current value in the "0" data write. Even when the asteroid curve shifts as shown in FIG. 6, the tolerance (hatched portion in FIG. 6) of the write current can be made wider than in a case in which the write current value in the "1" data write is the same as the write current value in the "0" data write. As a consequence, the write error resistance to the characteristic variation of the MTJ element 10 can be increased.

Figure 7:
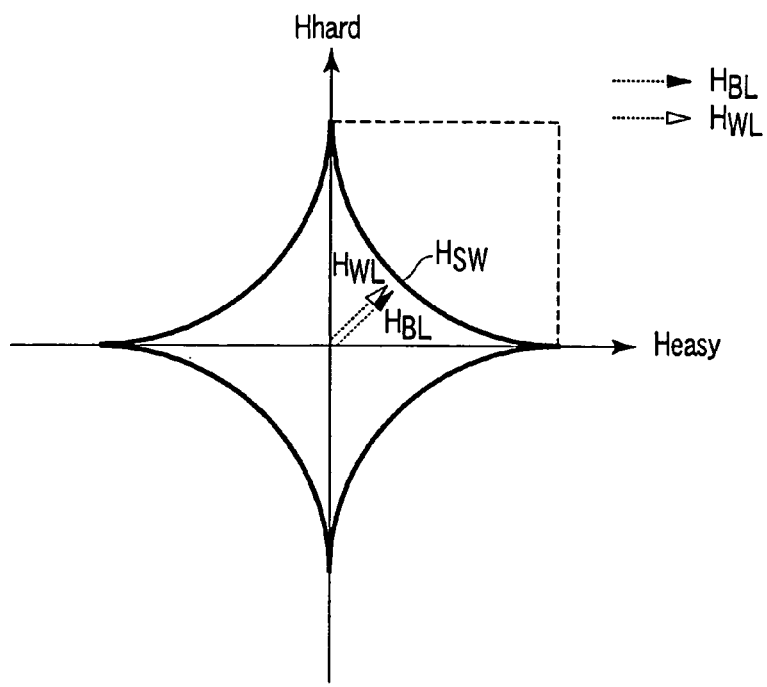
FIG. 7 is a view showing the asteroid curve of the magnetic random access memory according to the first embodiment of the present invention.

As shown in FIG. 7, a magnetic field larger than a switching field $H_{SW}$ can hardly be obtained by only the magnetic field by one of the write currents of the bit line BL and word line WL. Hence, any write error of a semi-selected cell can easily be suppressed.

Second Embodiment

The second embodiment is a modification to the first embodiment, in which tilt angles θ1 and θ2 of the oblique running portions of a bit line and word line are smaller than 45°.

Figure 8A:
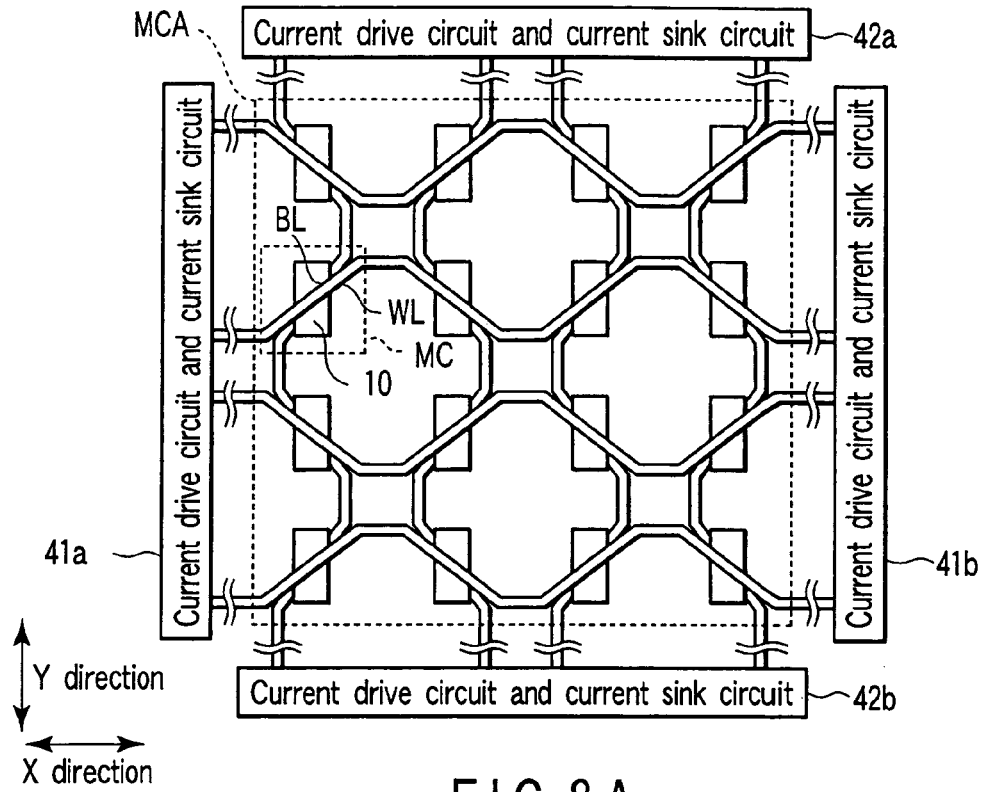
FIG. 8A is a schematic view of a memory cell array, which shows the cell layout of a magnetic random access memory according to a second embodiment of the present invention.
Figure 8B:
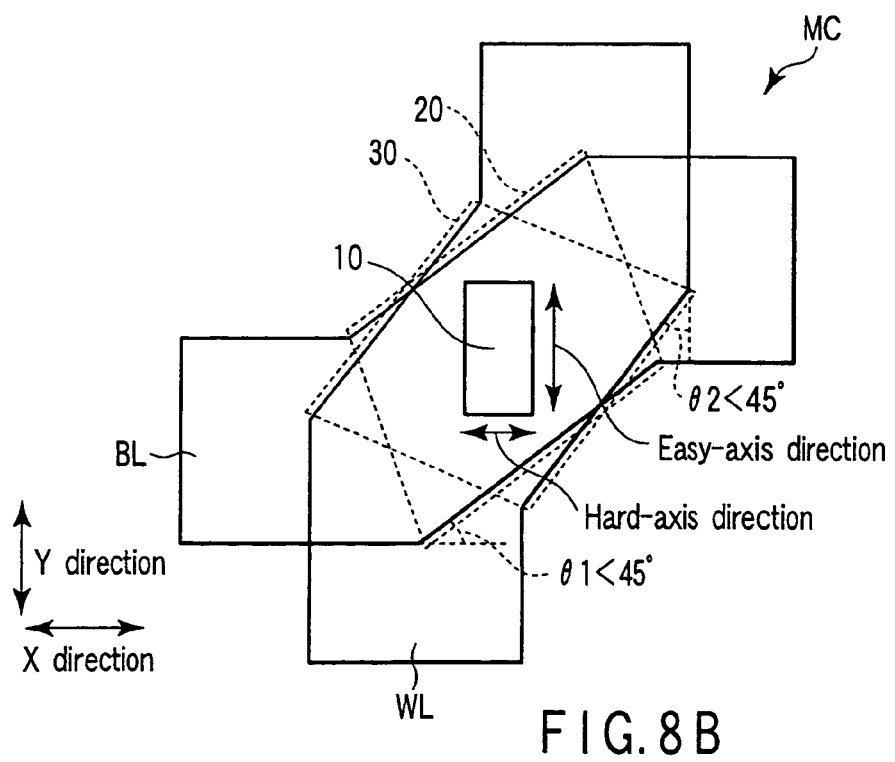
FIG. 8B is a plan view of a memory cell, which shows the cell layout of the magnetic random access memory according to the second embodiment of the present invention.

FIGS. 8A and 8B are views showing the cell layout of a magnetic random access memory according to the second embodiment of the present invention. The layout of the write wirings of the magnetic random access memory according to the second embodiment will be described below.

As shown in FIGS. 8A and 8B, the second embodiment is different from the first embodiment in that the tilt angle θ1 of an oblique running portion 20 of a bit line BL with respect to the direction of axis of hard magnetization (X direction) is smaller than 45°, and the tilt angle θ2 of an oblique running portion 30 of a word line WL with respect to the direction of axis of easy magnetization (Y direction) is smaller than 45°. In this embodiment, the angles θ1 and θ2 satisfy 0<θ1<45° and 0<θ2<45°.

Figure 9:
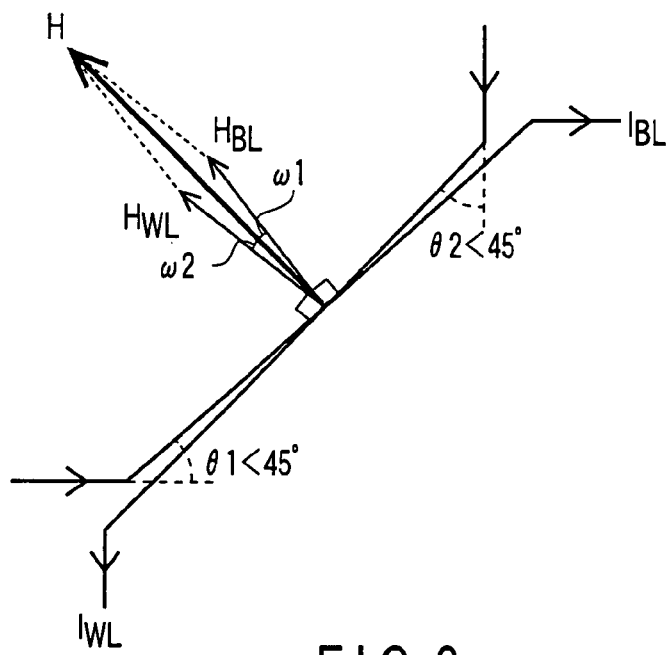
FIG. 9 is a schematic view showing the synthetic field in writing data in the magnetic random access memory according to the second embodiment of the present invention.

FIG. 9 is a schematic view showing the synthetic field in writing data in the magnetic random access memory according to the second embodiment of the present invention. The synthetic field in writing data in the magnetic random access memory according to the second embodiment will be described below.

As shown in FIG. 9, a synthetic field H of a magnetic field $H_{BL}$ generated from a write current $I_{BL}$ flowing to the bit line BL and a magnetic field $H_{WL}$ generated from a write current $I_{WL}$ flowing to the word line WL is given by $$H=H_{BL}\cos\omega1+H_{WL}\cos\omega2 \quad (1)$$

According to the second embodiment, the same effect as in the first embodiment can be obtained. In the second embodiment, the angle of the running direction of the oblique running portion 20 of the bit line BL with respect to the running direction (X direction or direction of axis of hard magnetization) of the entire bit line BL is smaller than 45°. In addition, the angle of the running direction of the oblique running portion 30 of the word line WL with respect to the running direction (Y direction or direction of axis of easy magnetization) of the entire word line WL is smaller than 45°. With this structure, the wiring length can be shorter than in the first embodiment. For this reason, the wiring resistance of the bit line BL and word line WL can be reduced.

Third Embodiment

The third embodiment is a modification to the first embodiment, in which tilt angles θ1 and θ2 of the oblique running portions of a bit line and word line are larger than 45°.

Figure 10A:
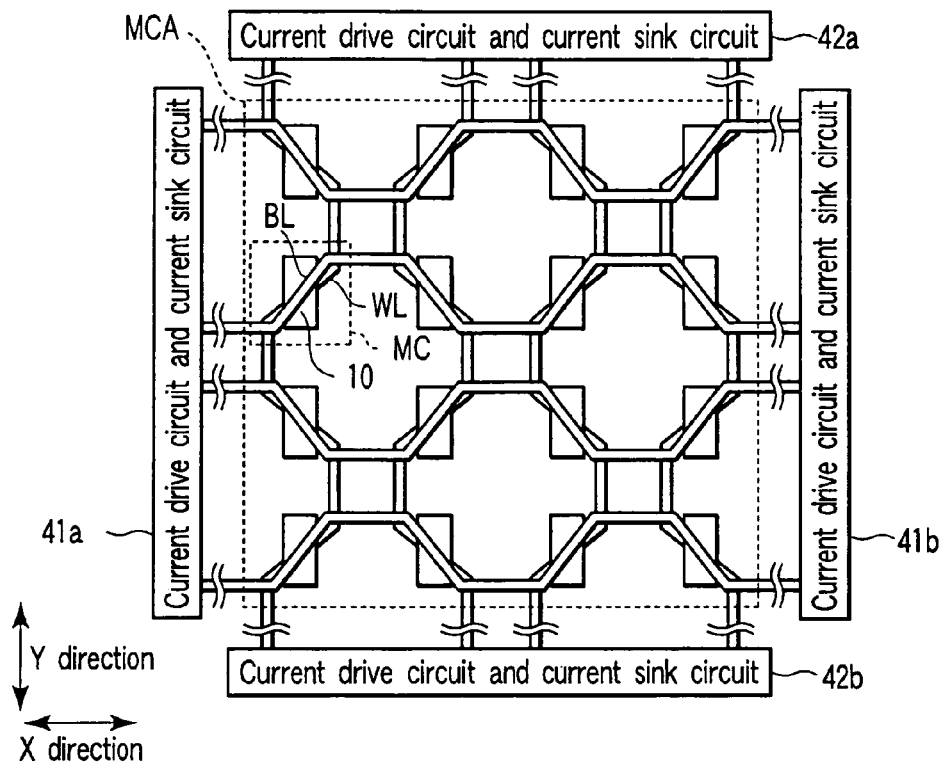
FIG. 10A is a schematic view of a memory cell array, which shows the cell layout of a magnetic random access memory according to a third embodiment of the present invention.
Figure 10B:
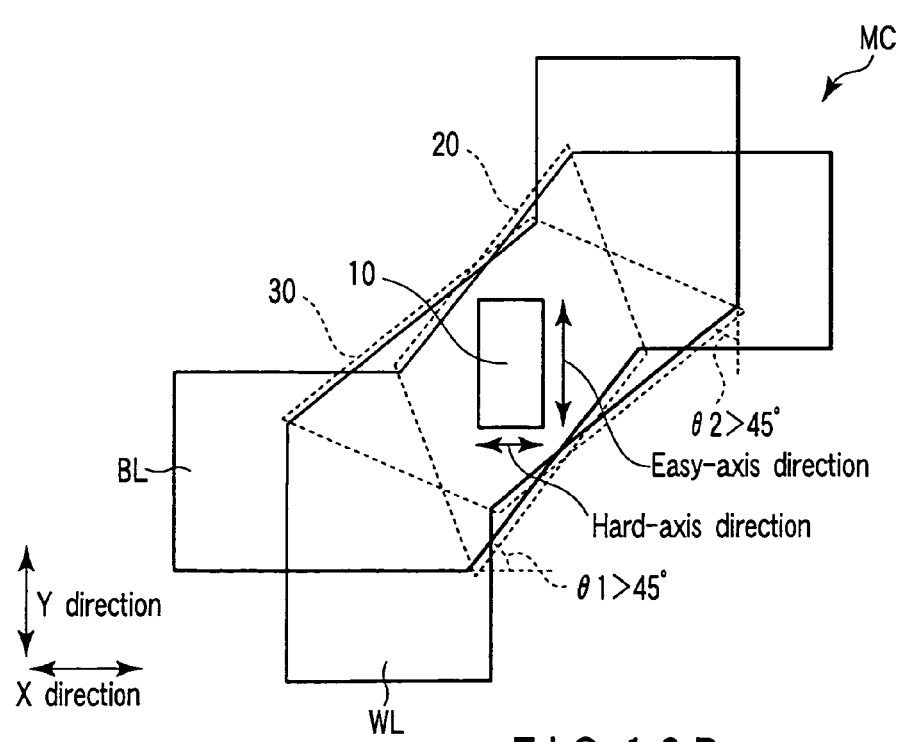
FIG. 10B is a plan view of a memory cell, which shows the cell layout of the magnetic random access memory according to the third embodiment of the present invention.

FIGS. 10A and 10B are views showing the cell layout of a magnetic random access memory according to the third embodiment of the present invention. The layout of the write wirings of the magnetic random access memory according to the third embodiment will be described below.

As shown in FIGS. 10A and 10B, the third embodiment is different from the first embodiment in that the tilt angle θ1 of an oblique running portion 20 of a bit line BL with respect to the direction of axis of hard magnetization (X direction) is larger than 45°, and the tilt angle θ2 of an oblique running portion 30 of a word line WL with respect to the direction of axis of easy magnetization (Y direction) is larger than 45°. In this embodiment, the angles θ1 and θ2 satisfy 45°<θ1<90° and 45°<θ2<90°.

Figure 11:
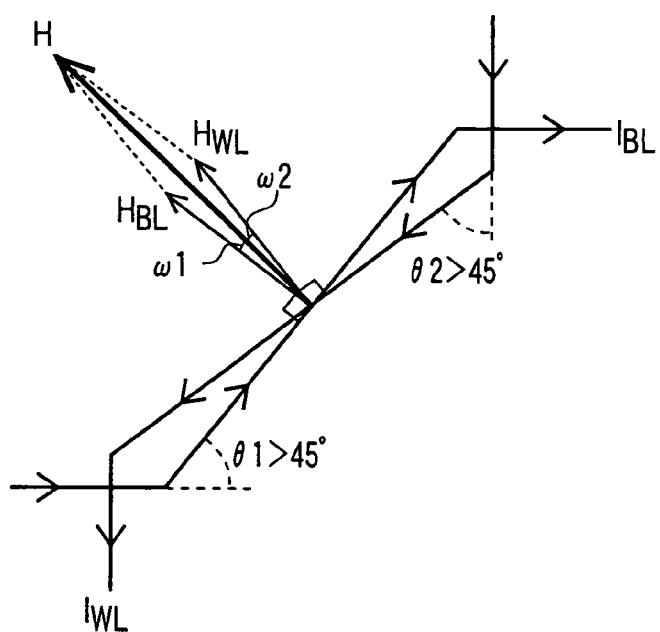
FIG. 11 is a schematic view showing the synthetic field in writing data in the magnetic random access memory according to the third embodiment of the present invention.

FIG. 11 is a schematic view showing the synthetic field in writing data in the magnetic random access memory according to the third embodiment of the present invention. The synthetic field in writing data in the magnetic random access memory according to the third embodiment will be described below.

As shown in FIG. 11, a synthetic field H of a magnetic field $H_{BL}$ generated from a write current $I_{BL}$ flowing to the bit line BL and a magnetic field $H_{WL}$ generated from a write current $I_{WL}$ flowing to the word line WL is given by equation (1), as in the second embodiment.

According to the third embodiment, the same effect as in the first embodiment can be obtained. In the third embodiment, the angle of the running direction of the oblique running portion 20 of the bit line BL with respect to the running direction (X direction or direction of axis of hard magnetization) of the entire bit line BL is larger than 45°. In addition, the angle of the running direction of the oblique running portion 30 of the word line WL with respect to the running direction (Y direction or direction of axis of easy magnetization) of the entire word line WL is larger than 45°. With this structure, the wiring length can be shorter than in the first embodiment. For this reason, the wiring resistance of the bit line BL and word line WL can be reduced.

Fourth Embodiment

The first embodiment of the present invention can also be applied to a so-called toggle memory cell proposed in U.S. Pat. No. 6,545,906. In the fourth embodiment, application to a toggle memory cell will be described.

Figure 12A:
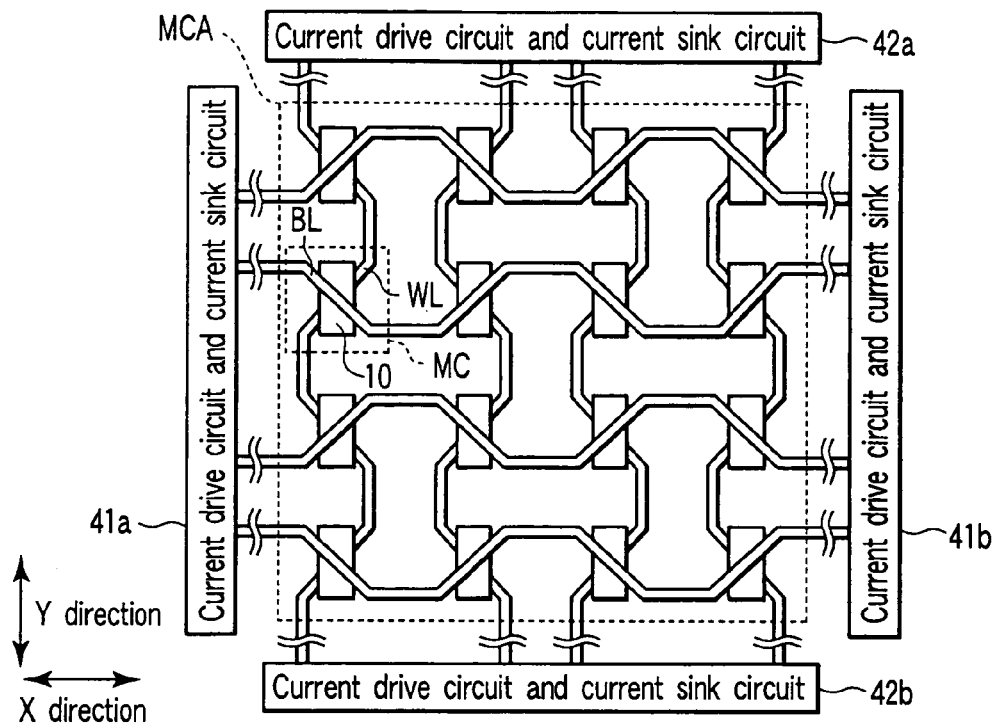
FIG. 12A is a schematic view of a memory cell array, which shows the cell layout of a magnetic random access memory according to a fourth embodiment of the present invention.
Figure 12B:
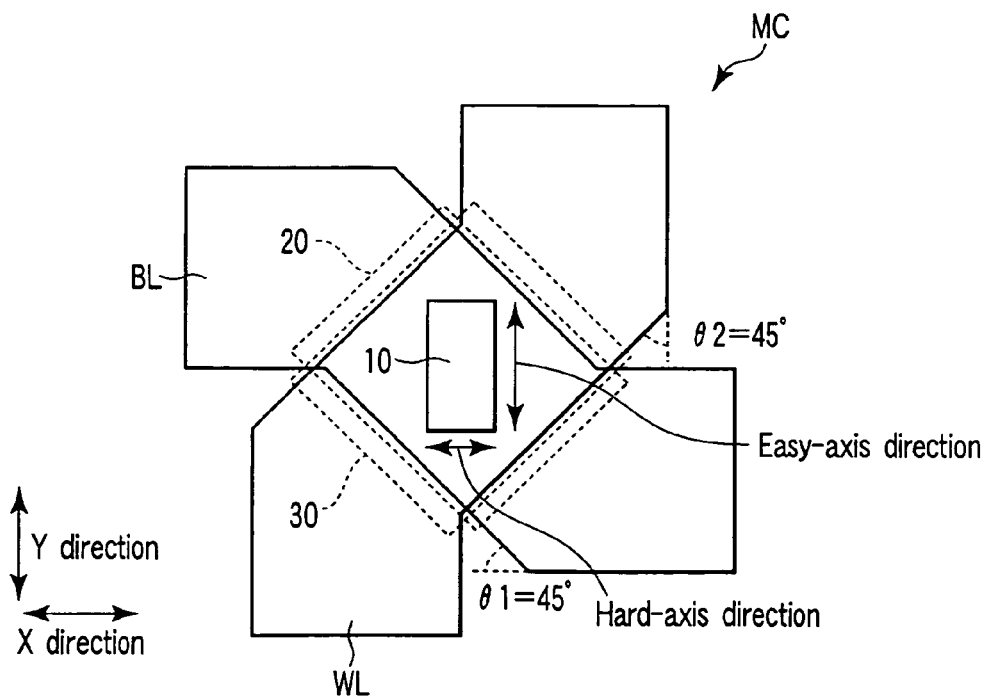
FIG. 12B is a plan view of a memory cell, which shows the cell layout of the magnetic random access memory according to the fourth embodiment of the present invention.

FIGS. 12A and 12B are views showing the cell layout of a magnetic random access memory according to the fourth embodiment of the present invention. The layout of the write wirings of the magnetic random access memory according to the fourth embodiment will be described below.

As shown in FIGS. 12A and 12B, the fourth embodiment is different from the first embodiment in that a bit line BL and word line WL cross near an MTJ element 10.

More specifically, the direction of axis of easy magnetization of the MTJ element 10 is directed in the Y direction in which the whole word line WL runs. The direction of axis of hard magnetization of the MTJ element 10 is directed in the X direction in which the whole bit line BL runs. The bit line BL has, near the MTJ element 10, an oblique running portion 20 which runs obliquely with respect to the direction of axis of hard magnetization. The word line WL has, near the MTJ element 10, an oblique running portion 30 which runs obliquely with respect to the direction of axis of easy magnetization. A tilt angle θ1 of the oblique running portion 20 of the bit line BL with respect to the direction of axis of hard magnetization (X direction) is 45°. A tilt angle θ2 of the oblique running portion 30 of the word line WL with respect to the direction of axis of easy magnetization (Y direction) is 45°. The oblique running portions 20 and 30 cross at 90°. In other words, the relative angle between the direction of a magnetic field generated from a write current which flows to the oblique running portion 20 of the bit line BL and the direction of a magnetic field generated from a write current which flows to the oblique running portion 30 of the word line WL is 90°.

In the above-described toggle memory cell, a data write is executed in the following way.

In a toggle write, before arbitrary data is written in a selected cell, the data of the selected cell is read out. If it is determined by reading out the data of the selected cell that the arbitrary data has already been written, no write is executed. If data different from the arbitrary data has been written, the write is executed to rewrite the data.

After the above-described confirmation cycle, if data must be written in the selected cell, two write wirings (bit line BL and word line WL) are sequentially turned on. The write wiring which has been turned on first is turned off first. Then, the write wiring which has been turned on later is turned off. For example, the procedures include four cycles: the word line WL is turned on to supply a write current $I_{WL}$→the bit line BL is turned on to supply a write current $I_{BL}$→the word line WL is turned off to stop supplying the write current $I_{WL}$→the bit line BL is turned off to stop supplying the write current $I_{BL}$.

In the conventional toggle cell layout, straight bit lines BL and word lines WL are laid out in a matrix perpendicularly to each other. MTJ elements are laid out at the intersections between the bit lines BL and word lines WL obliquely with respect to them. Since the MTJ element is laid out obliquely with respect to the running directions of the bit line BL and word line WL, the cell size is large.

In the fourth embodiment, the oblique running portions 20 and 30 of the bit line BL and word line WL are laid out obliquely near the MTJ element 10. The MTJ element 10 need not be laid out obliquely with respect to the running directions (X and Y directions) of the whole bit line BL and word line WL. For this reason, the memory cell size can be smaller than before.

Fifth Embodiment

The fifth embodiment is a modification to the fourth embodiment, in which tilt angles θ1 and θ2 of the oblique running portions of a bit line and word line are smaller than 45°.

Figure 13:
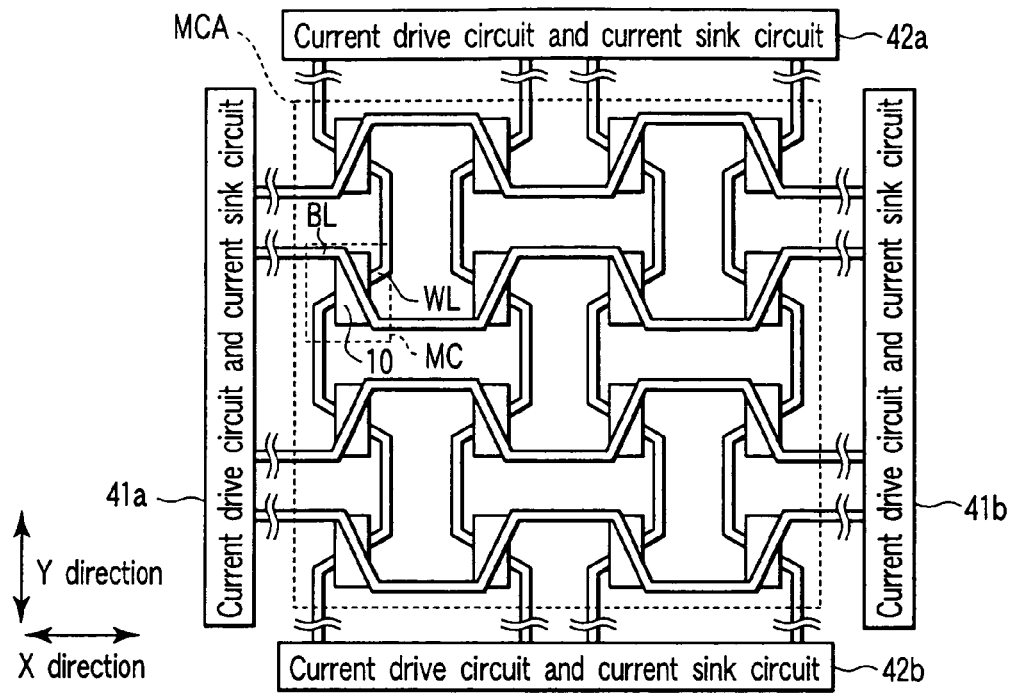
FIG. 13 is a view showing the layout of the memory cell array of a magnetic random access memory according to a fifth embodiment of the present invention.

FIG. 13 is a view showing the layout of the memory cell array of a magnetic random access memory according to the fifth embodiment of the present invention. The layout of the write wirings of the magnetic random access memory according to the fifth embodiment will be described below.

As shown in FIG. 13, the fifth embodiment is different from the fourth embodiment in that the tilt angle θ1 of an oblique running portion 20 of a bit line BL with respect to the direction of axis of hard magnetization (X direction) is smaller than 45°, and the tilt angle θ2 of an oblique running portion 30 of a word line WL with respect to the direction of axis of easy magnetization (Y direction) is smaller than 45°. In this embodiment, the angles θ1 and θ2 satisfy 0<θ1<45° and 0<θ2<45°.

According to the fifth embodiment, the same effect as in the fourth embodiment can be obtained. In the fifth embodiment, the angle of the running direction of the oblique running portion 20 of the bit line BL with respect to the running direction (X direction or direction of axis of hard magnetization) of the entire bit line BL is smaller than 45°. In addition, the angle of the running direction of the oblique running portion 30 of the word line WL with respect to the running direction (Y direction or direction of axis of easy magnetization) of the entire word line WL is smaller than 45°. With this structure, the wiring length can be shorter than in the fourth embodiment. For this reason, the wiring resistance of the bit line BL and word line WL can be reduced.

Sixth Embodiment

The sixth embodiment is a modification to the fourth embodiment, in which tilt angles θ1 and θ2 of the oblique running portions of a bit line and word line are larger than 45°.

Figure 14:
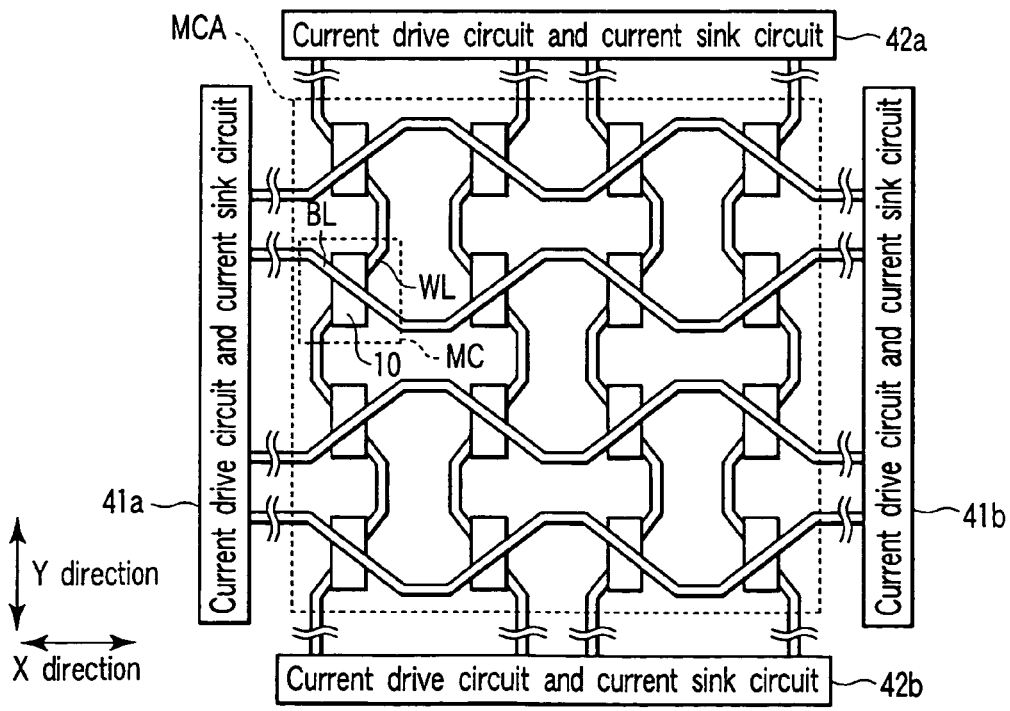
FIG. 14 is a view showing the layout of the memory cell array of a magnetic random access memory according to a sixth embodiment of the present invention.

FIG. 14 is a view showing the layout of the memory cell array of a magnetic random access memory according to the sixth embodiment of the present invention. The layout of the write wirings of the magnetic random access memory according to the sixth embodiment will be described below.

As shown in FIG. 14, the sixth embodiment is different from the fourth embodiment in that the tilt angle θ1 of an oblique running portion 20 of a bit line BL with respect to the direction of axis of hard magnetization (X direction) is larger than 45°, and the tilt angle θ2 of an oblique running portion 30 of a word line WL with respect to the direction of axis of easy magnetization (Y direction) is larger than 45°. In this embodiment, the angles θ1 and θ2 satisfy 45°<θ1<90° and 45°<θ2<90°.

According to the sixth embodiment, the same effect as in the fourth embodiment can be obtained. In the sixth embodiment, the angle of the running direction of the oblique running portion 20 of the bit line BL with respect to the running direction (X direction or direction of axis of hard magnetization) of the entire bit line BL is larger than 45°. In addition, the angle of the running direction of the oblique running portion 30 of the word line WL with respect to the running direction (Y direction or direction of axis of easy magnetization) of the entire word line WL is larger than 45°. With this structure, the wiring length can be shorter than in the fourth embodiment. For this reason, the wiring resistance of the bit line BL and word line WL can be reduced.

Seventh Embodiment

In the seventh embodiment, lower electrode wirings and contacts are laid out in the cell layout of the first embodiment.

Figure 15:
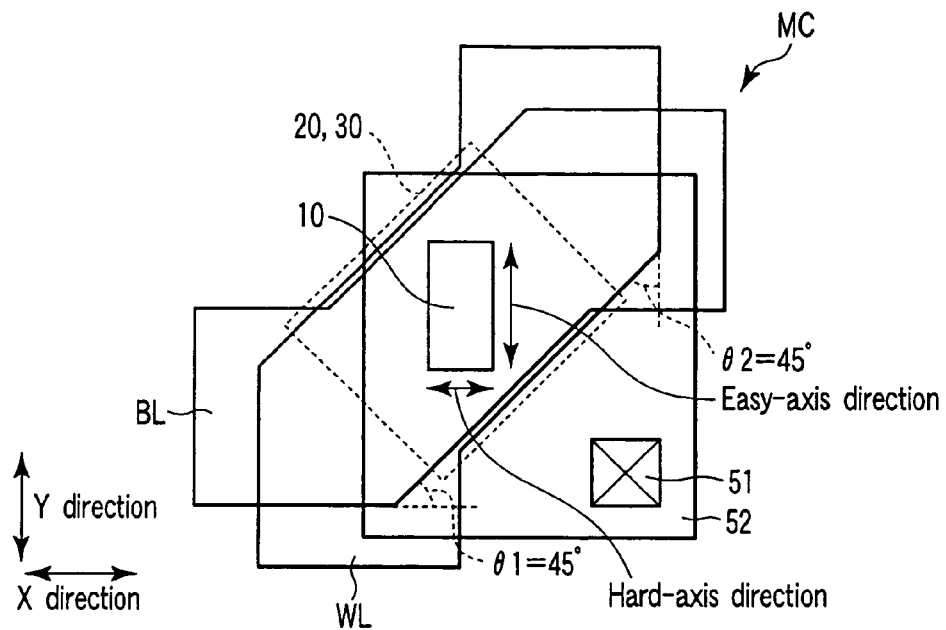
FIG. 15 is a view showing the layout of one cell of a magnetic random access memory according to a seventh embodiment of the present invention.

FIG. 15 is a view showing the layout of one cell of a magnetic random access memory according to the seventh embodiment of the present invention. The layout of one cell of a lower electrode wiring and a contact of the magnetic random access memory according to the seventh embodiment will be described below.

As shown in FIG. 15, the seventh embodiment is different from the first embodiment in that a lower electrode wiring 52 and contact 51 are laid out. The lower electrode wiring 52 is laid out between an MTJ element 10 and a bit line BL or word line WL. The lower electrode wiring 52 is electrically connected to the MTJ element 10. The contact 51 is laid out under the lower electrode wiring 52 to connect the lower electrode wiring 52 to a wiring formed under it.

The lower electrode wiring 52 has, e.g., a rectangular shape. The longitudinal direction of the rectangle is directed in the running direction (Y direction) of the word line WL. The widthwise direction of the rectangle is directed in the running direction (X direction) of the bit line BL. In other words, the longitudinal direction of the lower electrode wiring 52 is directed in the direction of axis of easy magnetization. The widthwise direction of the lower electrode wiring 52 is directed in the direction of axis of hard magnetization. The lower electrode wiring 52 is thinner than the bit line BL and word line WL.

FIGS. 16 to 19 are views showing layouts of the memory cell array of the magnetic random access memory according to the seventh embodiment of the present invention. The layouts of the memory cell array of the magnetic random access memory according to the seventh embodiment will be described below.

Figure 16:
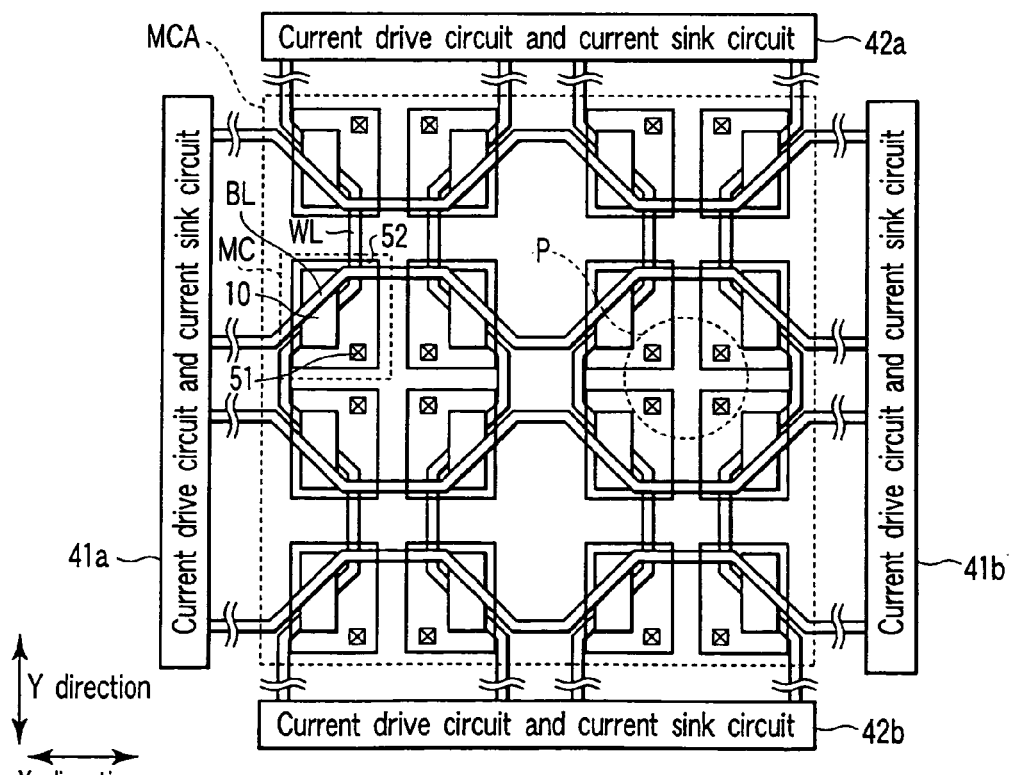
FIGS. 16 to 19 are views showing layouts of the memory cell array of the magnetic random access memory according to the seventh embodiment of the present invention.

In the layout shown in FIG. 16, the contacts 51 are concentrated at one portion P for every four cells in a memory cell array MCA. The four cells include four cells adjacent in the X and Y directions.

Figure 17:
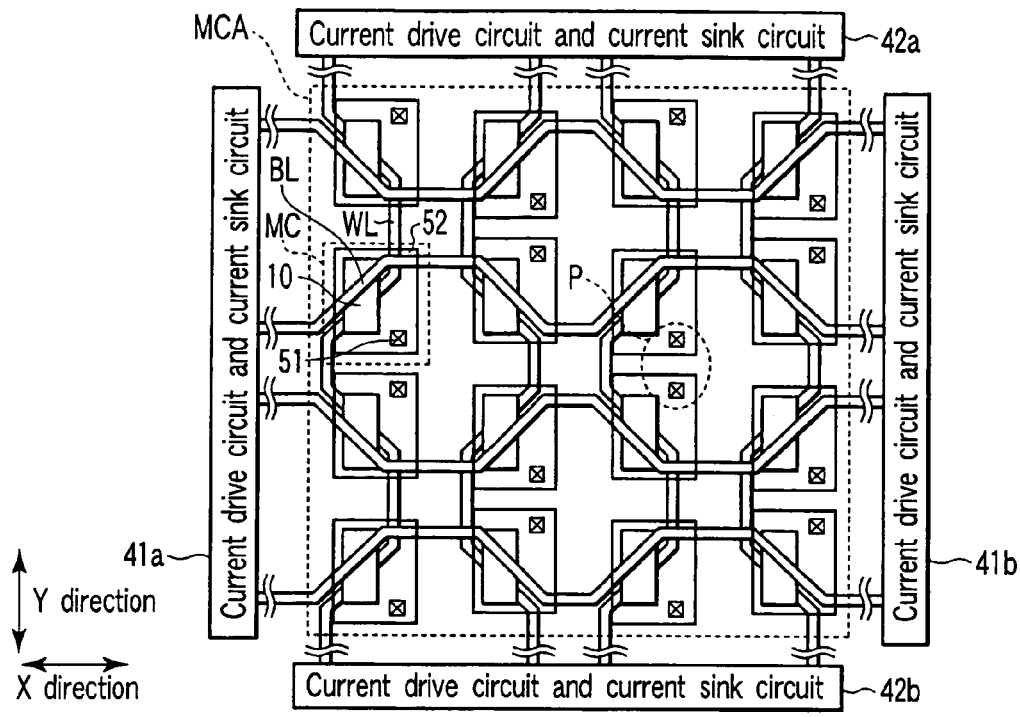
Figure 18:
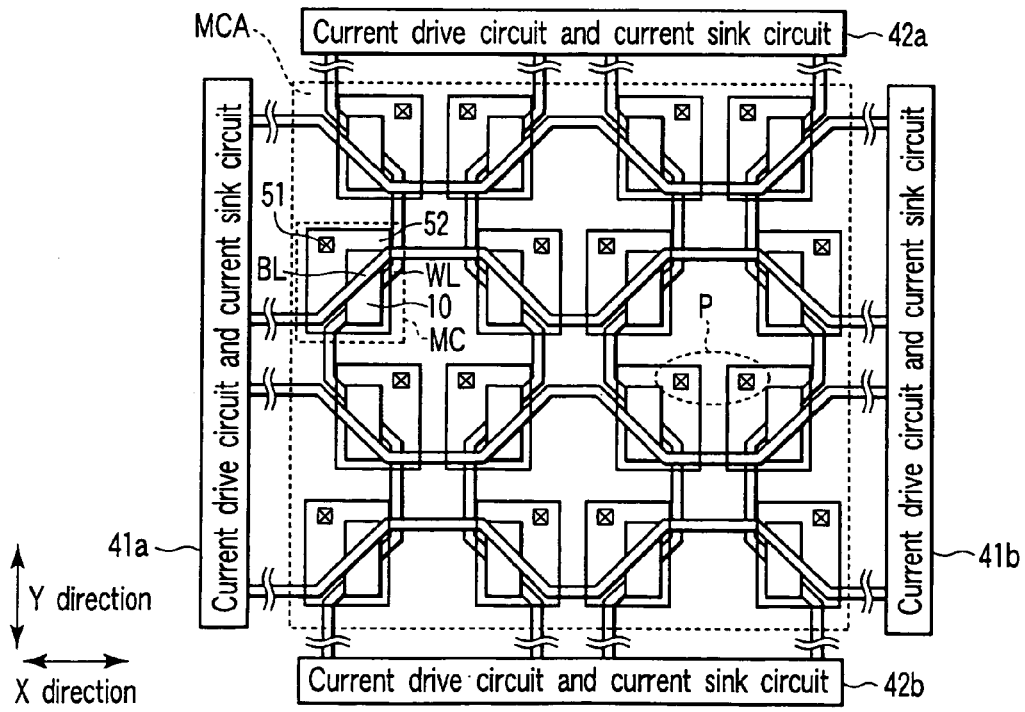
Figure 19:
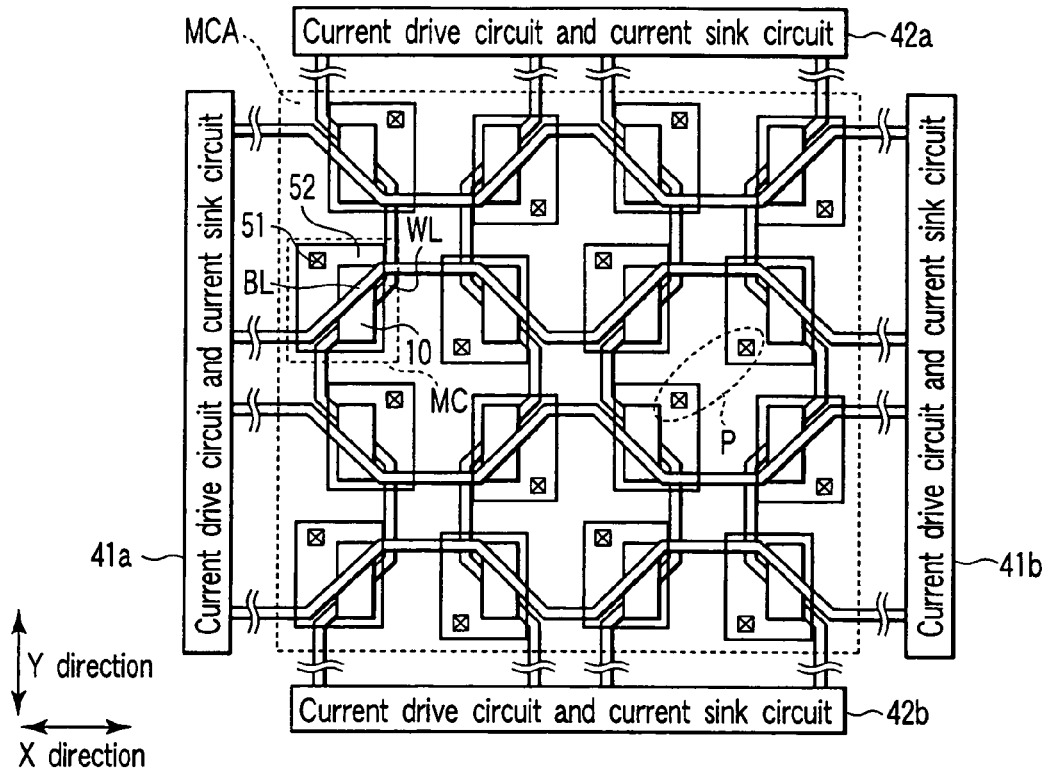

In the layouts shown in FIGS. 17 to 19, the number of contacts 51 concentrated at one portion P is ½ that in FIG. 16. That is, the contacts 51 are concentrated at one portion P for every two cells in the memory cell array MCA. Referring to FIG. 17, the two cells include two cells adjacent in the Y direction. Referring to FIG. 18, the two cells include two cells adjacent in the X direction. Referring to FIG. 19, the two cells include two cells adjacent obliquely in the X or Y direction.

According to the seventh embodiment, the same effect as in the first embodiment can be obtained. In the seventh embodiment, the contacts 51 can appropriately be concentrated as shown in FIG. 16 or distributed as shown in FIGS. 17 to 19 in accordance with the design rule of the lower electrode wirings 52 or the layout of wiring layers formed under the lower electrode wirings 52.

Eighth Embodiment

The eighth embodiment is a modification to the seventh embodiment, in which lower electrode wirings are laid out obliquely with respect to the running directions of whole bit lines and word lines.

Figure 20:
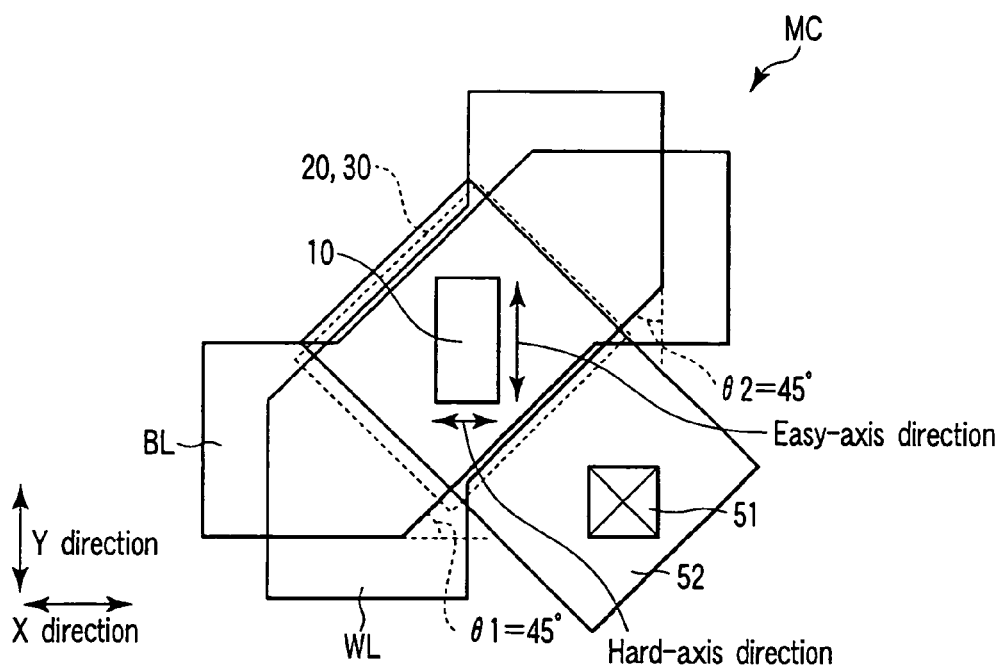
FIG. 20 is a view showing the layout of one cell of a magnetic random access memory according to an eighth embodiment of the present invention.

FIG. 20 is a view showing the layout of one cell of a magnetic random access memory according to the eighth embodiment of the present invention. The layout of one cell of a lower electrode wiring and a contact of the magnetic random access memory according to the eighth embodiment will be described below.

As shown in FIG. 20, the eighth embodiment is different from the seventh embodiment in that a lower electrode wiring 52 is laid out obliquely with respect to the running directions (X and Y directions) of a bit line BL and word line WL.

More specifically, the longitudinal and widthwise directions of the lower electrode wiring 52 having, e.g., a rectangular shape are tilted with respect to the running direction (Y direction) of the word line WL and the running direction (X direction) of the bit line BL. In other words, the longitudinal and widthwise directions of the lower electrode wiring 52 are tilted with respect to the direction of axis of easy magnetization and the direction of axis of hard magnetization. The widthwise direction of the lower electrode wiring 52 is directed in the running directions of oblique running portions 20 and 30 of the bit line BL and word line WL. The longitudinal direction of the lower electrode wiring 52 is tilted with respect to the X or Y direction by, e.g., 45°.

FIGS. 21 to 24 are views showing layouts of the memory cell array of the magnetic random access memory according to the eighth embodiment of the present invention. The layouts of the memory cell array of the magnetic random access memory according to the eighth embodiment will be described below.

In the layout shown in FIG. 21, contacts 51 are concentrated at one portion P for every four cells in a memory cell array MCA. The four cells include four cells adjacent in the X and Y directions.

Figure 23:
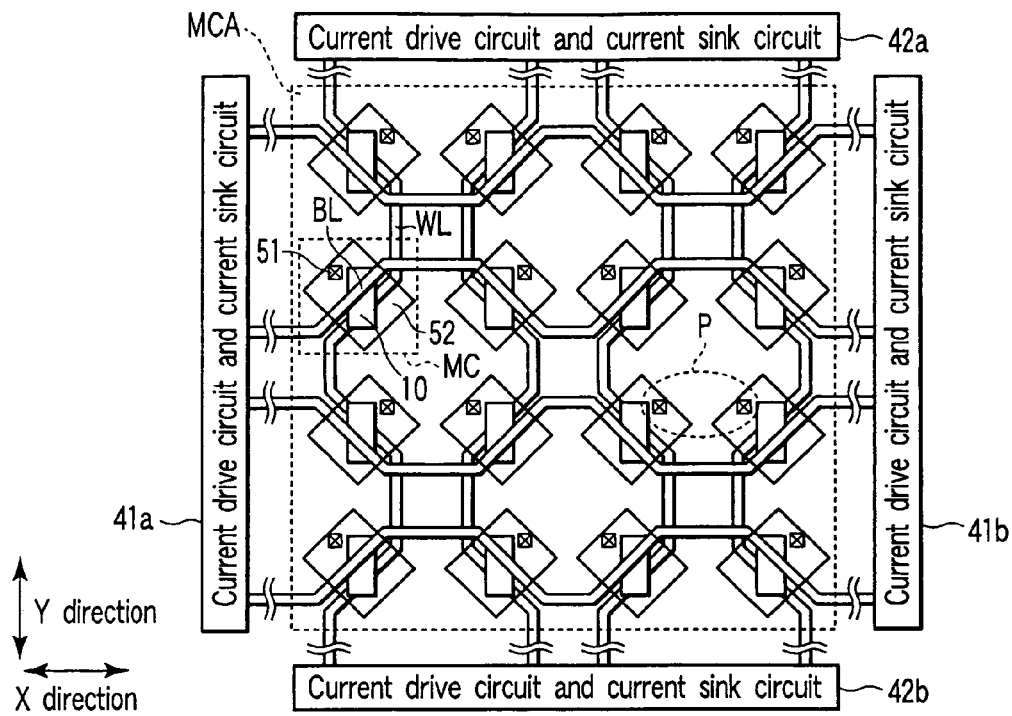
Figure 24:
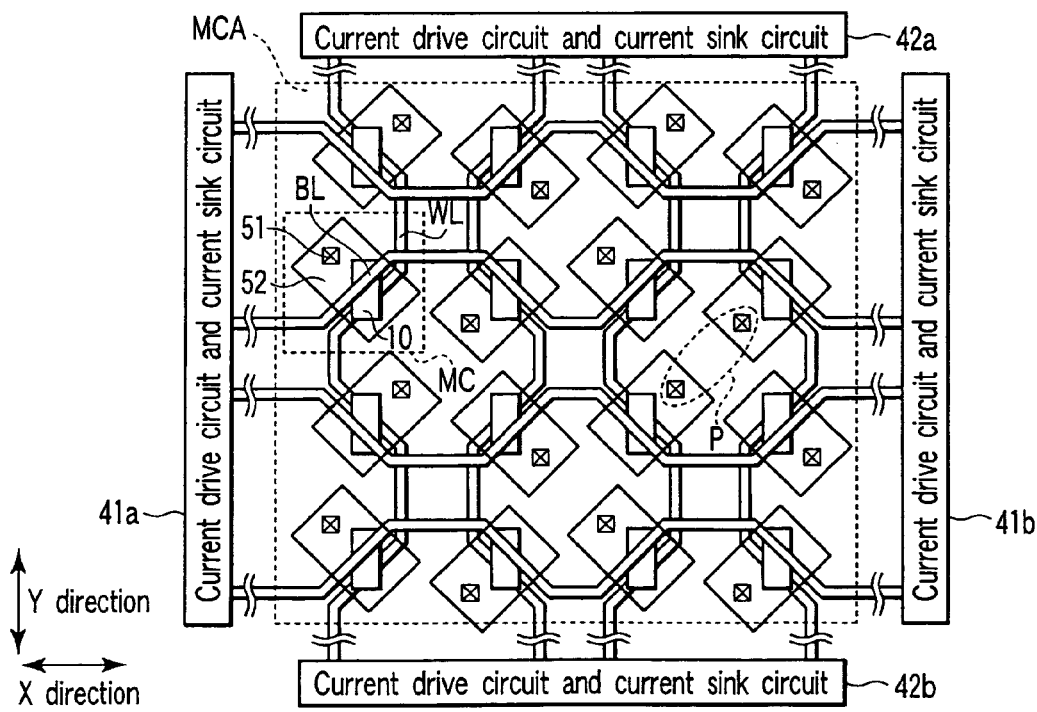

In the layouts shown in FIGS. 22 to 24, the number of contacts 51 concentrated at one portion P is ½ that in FIG. 21. That is, the contacts 51 are concentrated at one portion P for every two cells in the memory cell array MCA. Referring to FIG. 22, the two cells include two cells adjacent in the Y direction. Referring to FIG. 23, the two cells include two cells adjacent in the X direction. Referring to FIG. 24, the two cells include two cells adjacent obliquely in the X or Y direction.

According to the eighth embodiment, the same effect as in the first embodiment can be obtained. In the eighth embodiment, the contacts 51 can appropriately be concentrated as shown in FIG. 21 or distributed as shown in FIGS. 22 to 24 in accordance with the design rule of the lower electrode wirings 52 or the layout of wiring layers formed under the lower electrode wirings 52.

Ninth Embodiment

In the ninth embodiment, lower electrode wirings and contacts are laid out in the toggle cell layout of the fourth embodiment.

Figure 25:
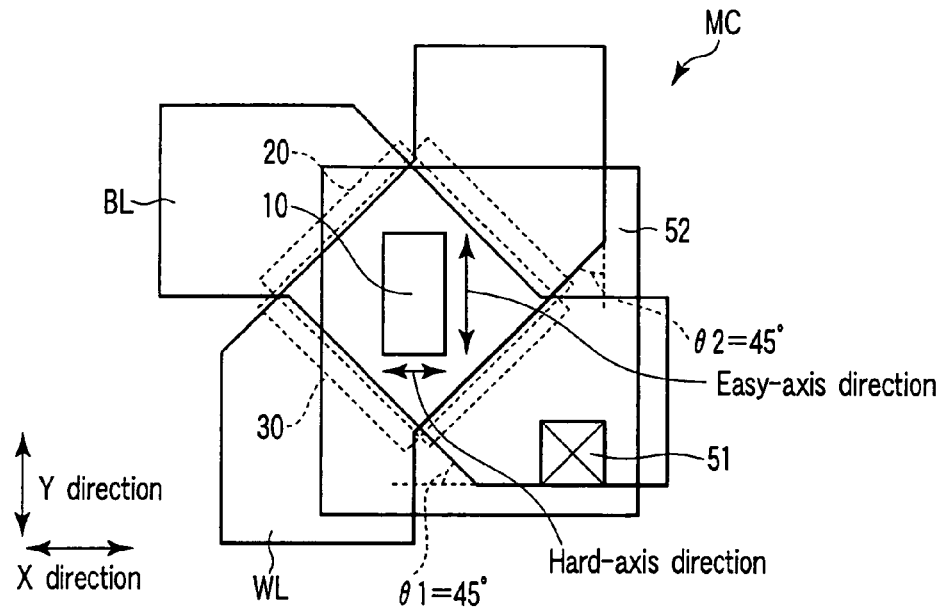
FIG. 25 is a view showing the layout of one cell of a magnetic random access memory according to a ninth embodiment of the present invention.

FIG. 25 is a view showing the layout of one cell of a magnetic random access memory according to the ninth embodiment of the present invention. The layout of one cell of a lower electrode wiring and a contact of the magnetic random access memory according to the ninth embodiment will be described below.

As shown in FIG. 25, the ninth embodiment is different from the fourth embodiment in that a lower electrode wiring 52 and contact 51 are laid out. The lower electrode wiring 52 is laid out between an MTJ element 10 and a bit line BL or word line WL. The contact 51 is laid out under the lower electrode wiring 52 to connect the lower electrode wiring 52 to a wiring formed under it.

The lower electrode wiring 52 has, e.g., a rectangular shape. The longitudinal direction of the rectangle is directed in the running direction (Y direction) of the word line WL. The widthwise direction of the rectangle is directed in the running direction (X direction) of the bit line BL. In other words, the longitudinal direction of the lower electrode wiring 52 is directed in the direction of axis of easy magnetization. The widthwise direction of the lower electrode wiring 52 is directed in the direction of axis of hard magnetization. The lower electrode wiring 52 is thinner than the bit line BL and word line WL.

FIGS. 26 to 29 are views showing layouts of the memory cell array of the magnetic random access memory according to the ninth embodiment of the present invention. The layouts of the memory cell array of the magnetic random access memory according to the ninth embodiment will be described below.

Figure 26:
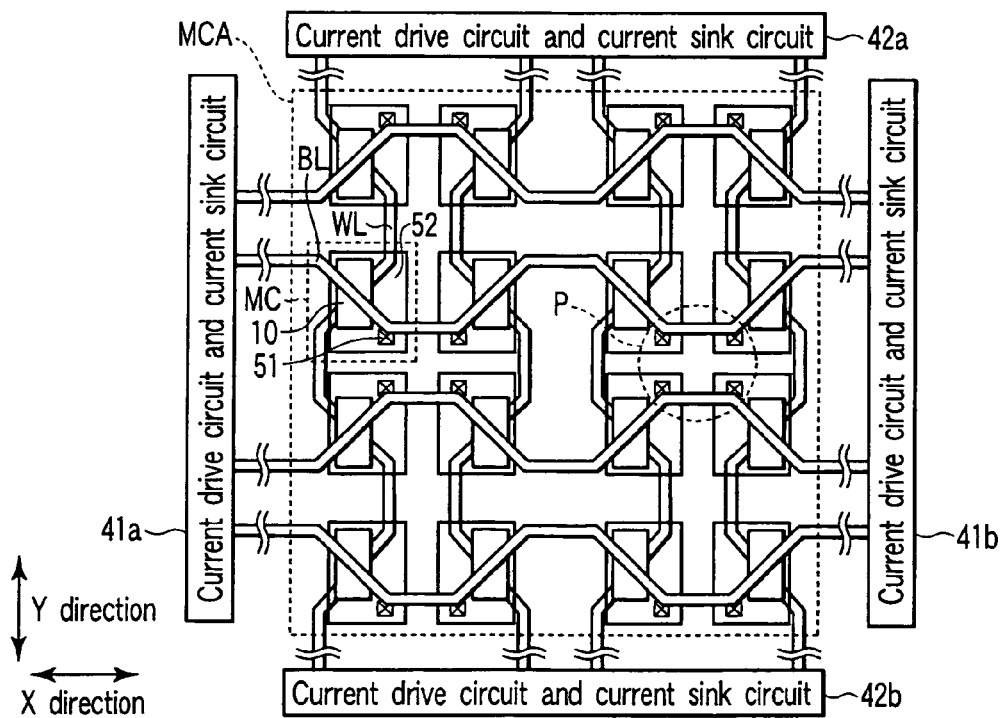
FIGS. 26 to 29 are views showing layouts of the memory cell array of the magnetic random access memory according to the ninth embodiment of the present invention.

In the layout shown in FIG. 26, the contacts 51 are concentrated at one portion P for every four cells in a memory cell array MCA. The four cells include four cells adjacent in the X and Y directions.

Figure 27:
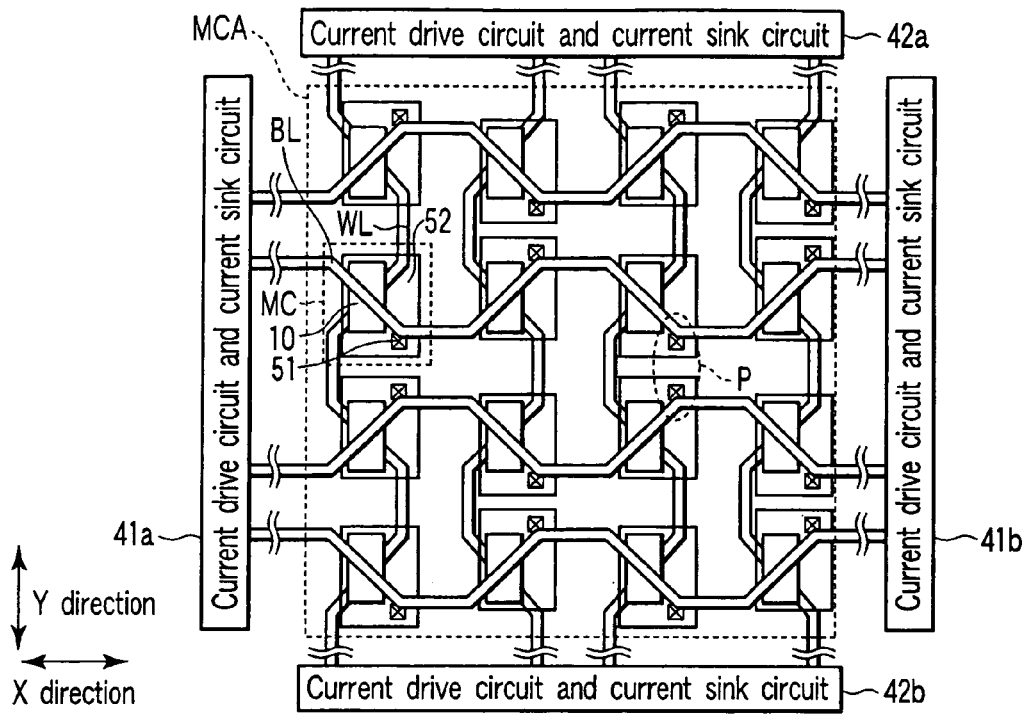
Figure 28:
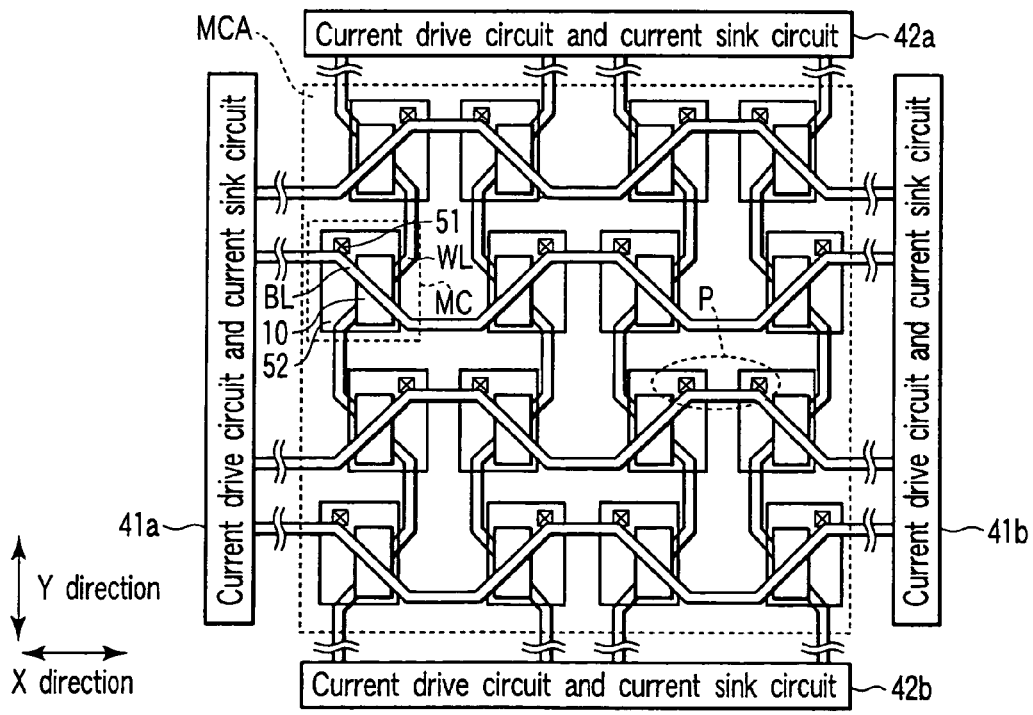
Figure 29:
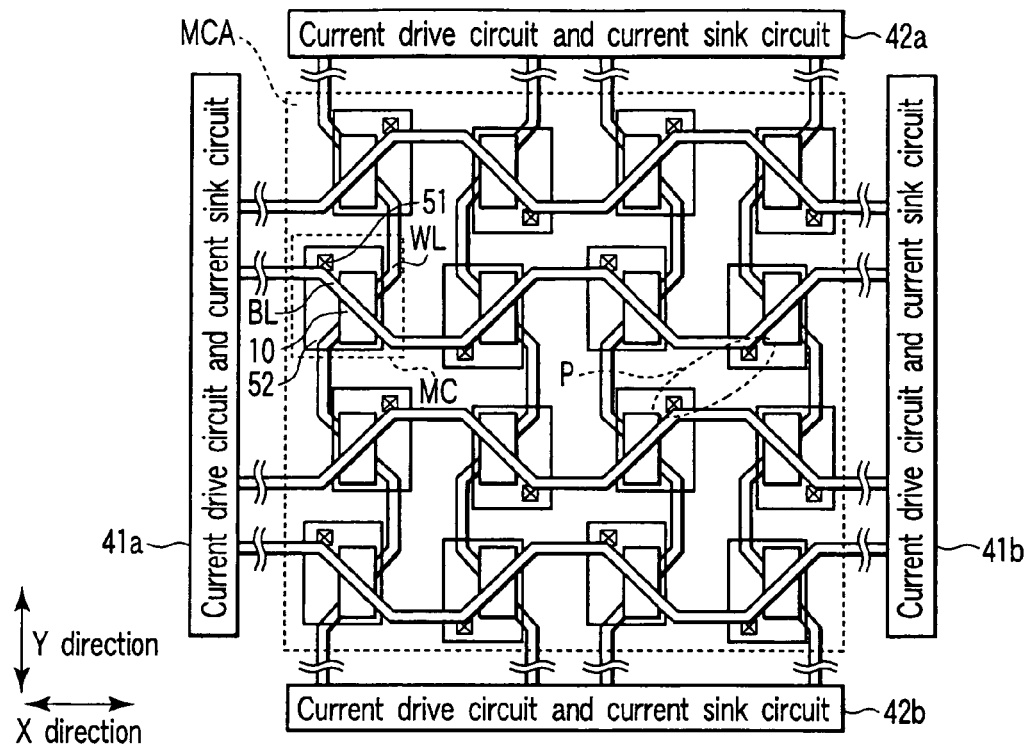

In the layouts shown in FIGS. 27 to 29, the number of contacts 51 concentrated at one portion P is ½ that in FIG. 26. That is, the contacts 51 are concentrated at one portion P for every two cells in the memory cell array MCA. Referring to FIG. 27, the two cells include two cells adjacent in the Y direction. Referring to FIG. 28, the two cells include two cells adjacent in the X direction. Referring to FIG. 29, the two cells include two cells adjacent obliquely in the X or Y direction.

According to the ninth embodiment, the same effect as in the fourth embodiment can be obtained. In the ninth embodiment, the contacts 51 can appropriately be concentrated as shown in FIG. 26 or distributed as shown in FIGS. 27 to 29 in accordance with the design rule of the lower electrode wirings 52 or the layout of wiring layers formed under the lower electrode wirings 52.

Tenth Embodiment

The tenth embodiment is a modification to the ninth embodiment, in which lower electrode wirings are laid out obliquely with respect to the running directions of whole bit lines and word lines.

Figure 30:
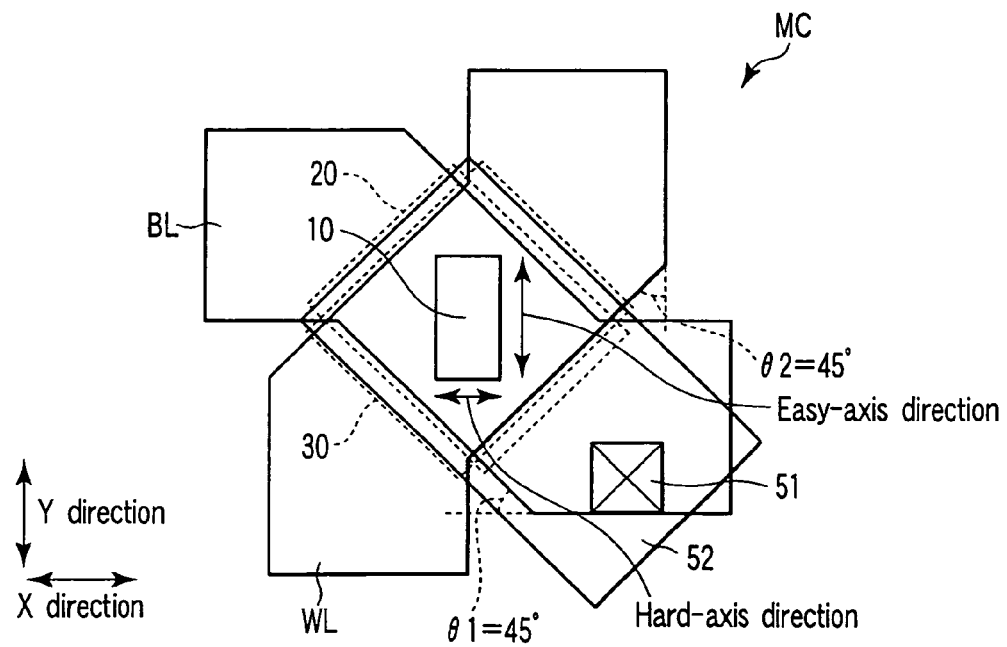
FIG. 30 is a view showing the layout of one cell of a magnetic random access memory according to a tenth embodiment of the present invention.

FIG. 30 is a view showing the layout of one cell of a magnetic random access memory according to the tenth embodiment of the present invention. The layout of one cell of a lower electrode wiring and a contact of the magnetic random access memory according to the tenth embodiment will be described below.

As shown in FIG. 30, the tenth embodiment is different from the ninth embodiment in that a lower electrode wiring 52 is laid out obliquely with respect to the running directions (X and Y directions) of a bit line BL and word line WL.

More specifically, the longitudinal and widthwise directions of the lower electrode wiring 52 having, e.g., a rectangular shape are tilted with respect to the running direction (Y direction) of the word line WL and the running direction (X direction) of the bit line BL. In other words, the longitudinal and widthwise directions of the lower electrode wiring 52 are tilted with respect to the direction of axis of easy magnetization and the direction of axis of hard magnetization. The widthwise direction of the lower electrode wiring 52 is directed in the running directions of oblique running portions 20 and 30 of the bit line BL and word line WL. The longitudinal direction of the lower electrode wiring 52 is tilted with respect to the X or Y direction by, e.g., 45°.

FIGS. 31 to 34 are views showing layouts of the memory cell array of the magnetic random access memory according to the tenth embodiment of the present invention. The layouts of the memory cell array of the magnetic random access memory according to the tenth embodiment will be described below.

In the layout shown in FIG. 31, contacts 51 are concentrated at one portion P for every four cells in a memory cell array MCA. The four cells include four cells adjacent in the X and Y directions.

Figure 33:
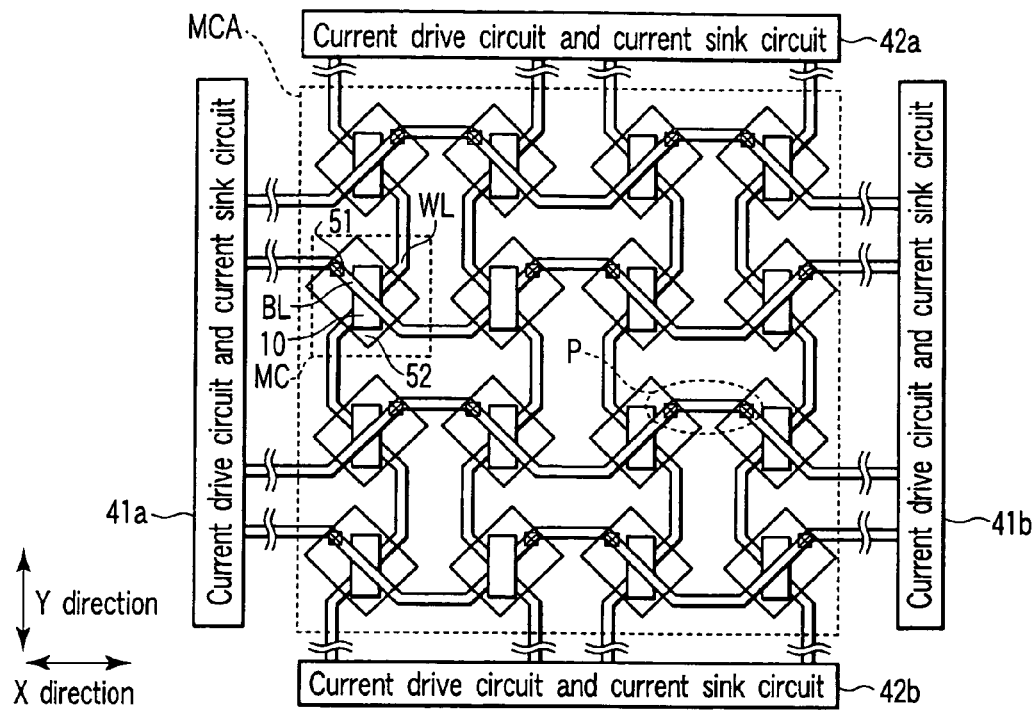
Figure 34:
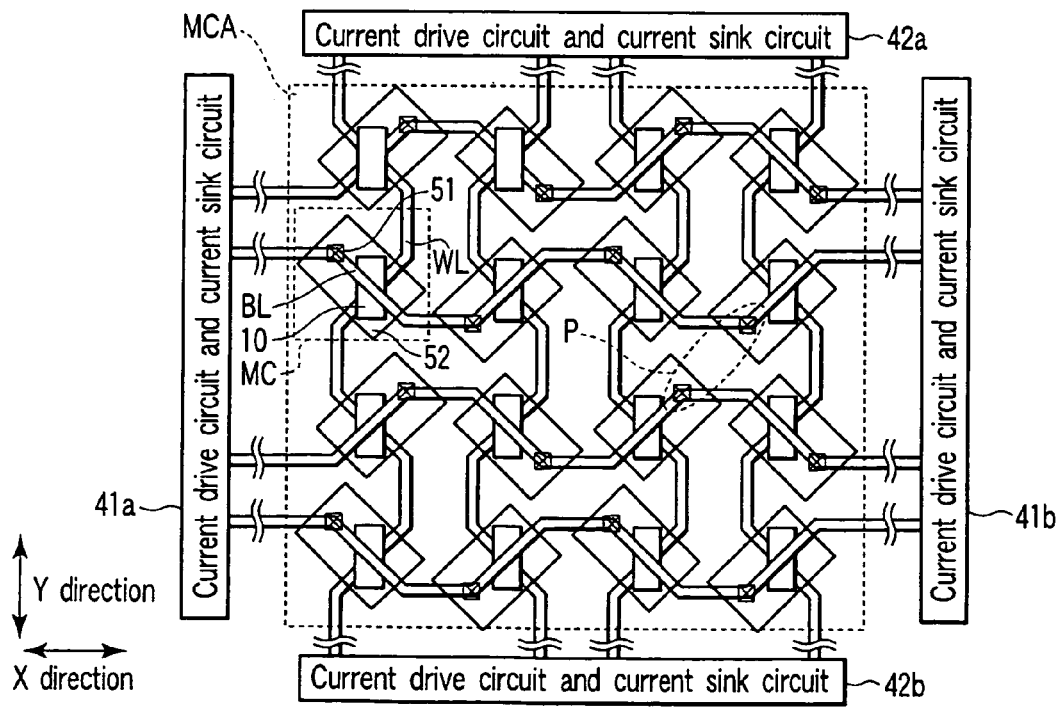

In the layouts shown in FIGS. 32 to 34, the number of contacts 51 concentrated at one portion P is ½ that in FIG. 31. That is, the contacts 51 are concentrated at one portion P for every two cells in the memory cell array MCA. Referring to FIG. 32, the two cells include two cells adjacent in the Y direction. Referring to FIG. 33, the two cells include two cells adjacent in the X direction. Referring to FIG. 34, the two cells include two cells adjacent obliquely in the X or Y direction.

According to the tenth embodiment, the same effect as in the first embodiment can be obtained. In the tenth embodiment, the contacts 51 can appropriately be concentrated as shown in FIG. 31 or distributed as shown in FIGS. 32 to 34 in accordance with the design rule of the lower electrode wirings 52 or the layout of wiring layers formed under the lower electrode wirings 52.

Eleventh Embodiment

In the eleventh embodiment, examples of the cell structure of a magnetic random access memory will be described. Views to be referred to in this embodiment are schematic views. When a cell structure according to this embodiment is to be applied to the above-described embodiments, the views are changed variously by, e.g., making bit lines BL and word lines WL run in a zigzag pattern.

(A) Cross-Point Structure

Figure 35A:
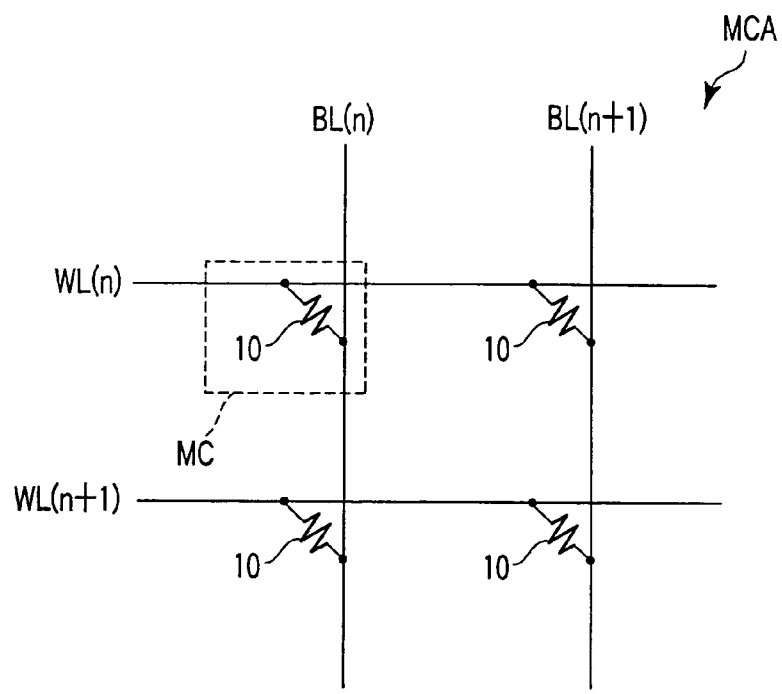
FIG. 35A is a circuit diagram showing the memory cell array of a magnetic random access memory according to an eleventh embodiment of the present invention, which includes memory cells having a cross-point structure.
Figure 35B:
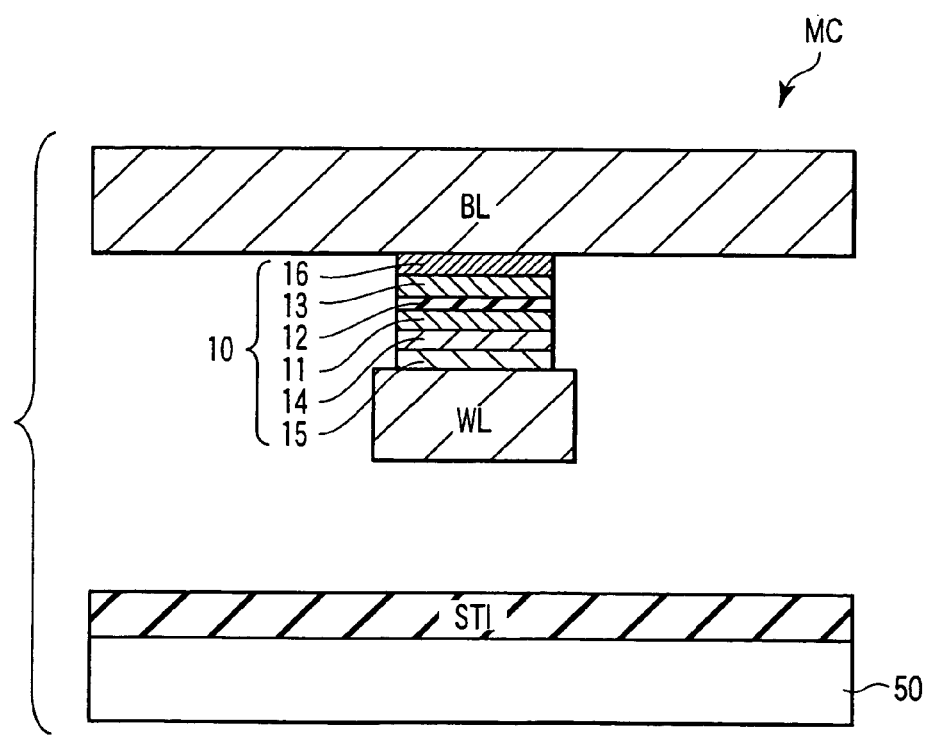
FIG. 35B is a sectional view showing one memory cell having a cross-point structure in the magnetic random access memory according to the eleventh embodiment of the present invention.

FIGS. 35A and 35B are a circuit diagram and sectional view, respectively, showing a magnetic random access memory having a cross-point structure according to the eleventh embodiment of the present invention. A so-called cross-point cell will be described below. The cross-point structure can be applied to a cell of the magnetic random access memories according to, e.g., the first to sixth embodiments.

As shown in FIGS. 35A and 35B, one cell MC having a cross-point structure includes one MTJ element 10, bit line BL, and word line WL. A memory cell array MCA is formed by laying out a plurality of memory cells MC in an array.

More specifically, the MTJ element 10 is arranged near the intersection between the bit line BL and the word line WL. One terminal of the MTJ element 10 is connected to the word line WL. The other terminal of the MTJ element 10 is connected to the bit line BL. The MTJ element 10 includes a fixed layer (pinned layer) 11 having a fixed magnetization, a recording layer (free layer) 13 having a reversed magnetization, a nonmagnetic layer (e.g., a tunnel barrier layer) 12 sandwiched between the fixed layer 11 and the recording layer 13, an anti-ferromagnetic layer 14 to fix the magnetization direction of the fixed layer 11, a lower electrode 15, and an upper electrode 16.

The fixed layer 11 of the MTJ element 10 is arranged on the side of the word line WL. The recording layer 13 of the MTJ element 10 is arranged on the side of the bit line BL. This arrangement may be reversed. In addition, for example, a hard mask may be inserted between the MTJ element 10 and the bit line BL.

In the cross-point memory cell MC, the data write and read are executed in the following way.

The write operation is executed in the following way. The bit line BL and word line WL corresponding to a selected one of the plurality of MTJ elements 10 are selected. When write currents $I_{BL}$ and $I_{WL}$ are supplied to the selected bit line BL and word line WL, a synthetic field H by the write currents $I_{BL}$ and $I_{WL}$ is applied to the MTJ element 10. Accordingly, the magnetization of the recording layer 13 of the MTJ element 10 is reversed to create a state in which the magnetization directions of the fixed layer 11 and recording layer 13 are parallel or anti-parallel. For example, when the parallel state is defined as a "1" state, and the anti-parallel state is defined as a "0" state, a binary data write is implemented.

The read operation is executed in the following way. The bit line BL and word line WL corresponding to the selected MTJ element 10 are selected. A read current Ir which tunnels the nonmagnetic layer 12 of the MTJ element 10 is supplied. The junction resistance changes in proportion to the cosine of the relative angle of the magnetizations of the fixed layer 11 and recording layer 13. When the magnetization of the MTJ element 10 is in the parallel state (e.g., the "1" state), the resistance is low. In the anti-parallel state (e.g., the "0" state), the resistance is high. That is, a TMR (Tunneling MagnetoResistive) effect is obtained. The "1" or "0" state of the MTJ element 10 is determined by reading the difference in resistance.

(B) Divided Cross-Point Structure

Figure 36A:
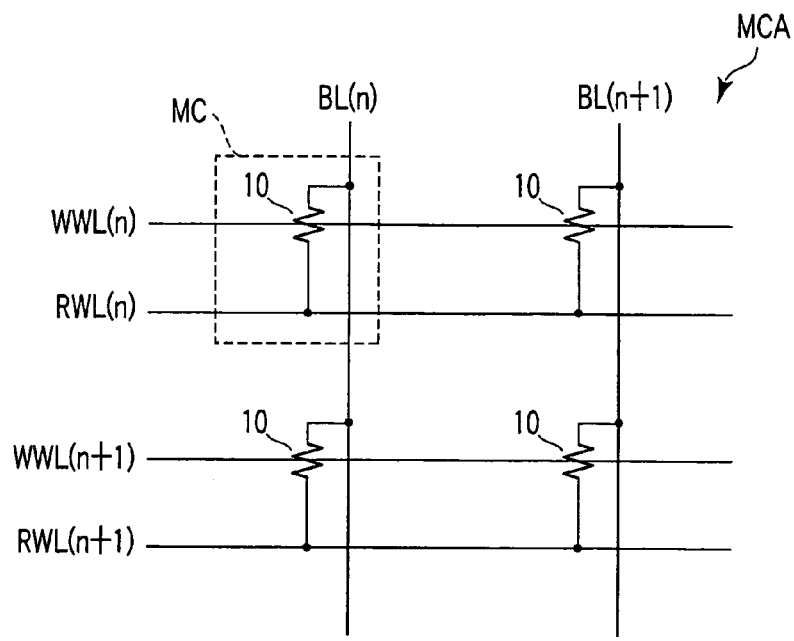
FIG. 36A is a circuit diagram showing the memory cell array of a magnetic random access memory according to the eleventh embodiment of the present invention, which includes memory cells having a divided cross-point structure.
Figure 36B:
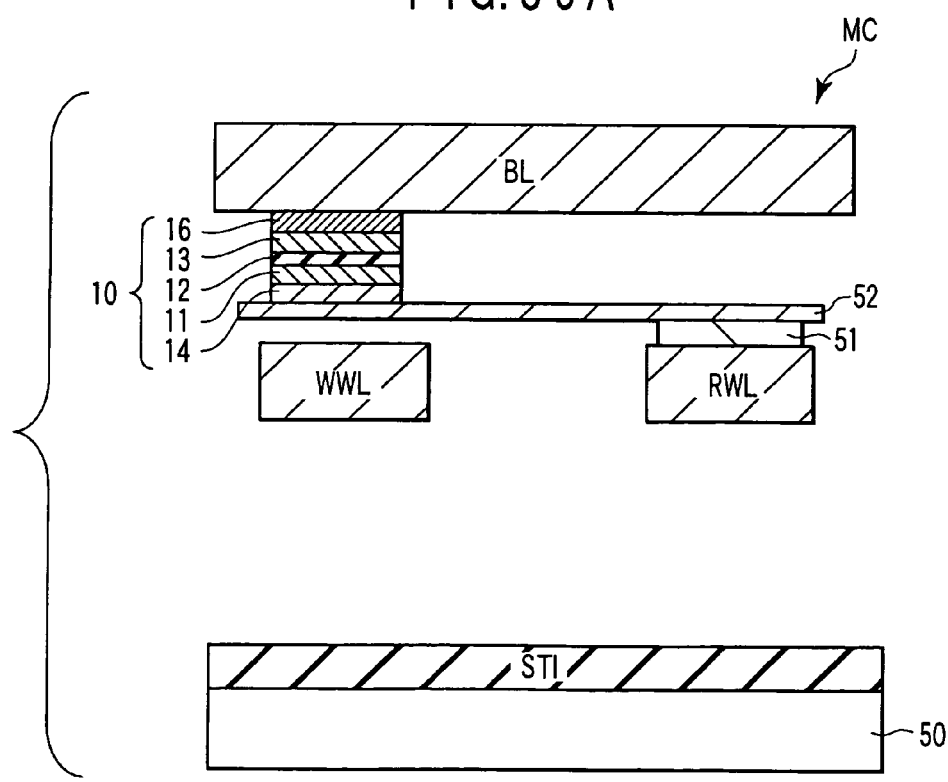
FIG. 36B is a sectional view showing one memory cell having a divided cross-point structure in the magnetic random access memory according to the eleventh embodiment of the present invention.

FIGS. 36A and 36B are a circuit diagram and sectional view, respectively, showing a magnetic random access memory having a divided cross-point structure according to the eleventh embodiment of the present invention. A so-called divided cross-point cell will be described below. The divided cross-point structure can be applied to a cell of the magnetic random access memories according to, e.g., the seventh to tenth embodiments.

As shown in FIGS. 36A and 36B, one cell MC having a divided cross-point structure includes one MTJ element 10, bit line BL, write word line WWL, and read word line RWL. The memory cell array MCA is formed by laying out a plurality of memory cells MC in an array.

More specifically, one terminal of the MTJ element 10 is connected to the read word line RWL through a lower electrode wiring 52 and contact 51. The other terminal of the MTJ element 10 is connected to the bit line BL. The write word line WWL electrically disconnected from the MTJ element 10 is arranged under the MTJ element 10.

In the divided cross-point memory cell MC, the data write and read are executed in almost the same way as in the cross-point cell. The word line is selectively used in the write and read. In the write, the write word line WWL and bit line BL are used. The write currents $I_{BL}$ and $I_{WL}$ are supplied to the write word line WWL and bit line BL to set the magnetization of the MTJ element 10 in the parallel or anti-parallel state. On the other hand, in the read, the read word line RWL and bit line BL are used. The read current Ir is supplied to the MTJ element 10, and the resistance of the MTJ element 10 is read.

(C) Select Transistor Structure

Figure 37A:
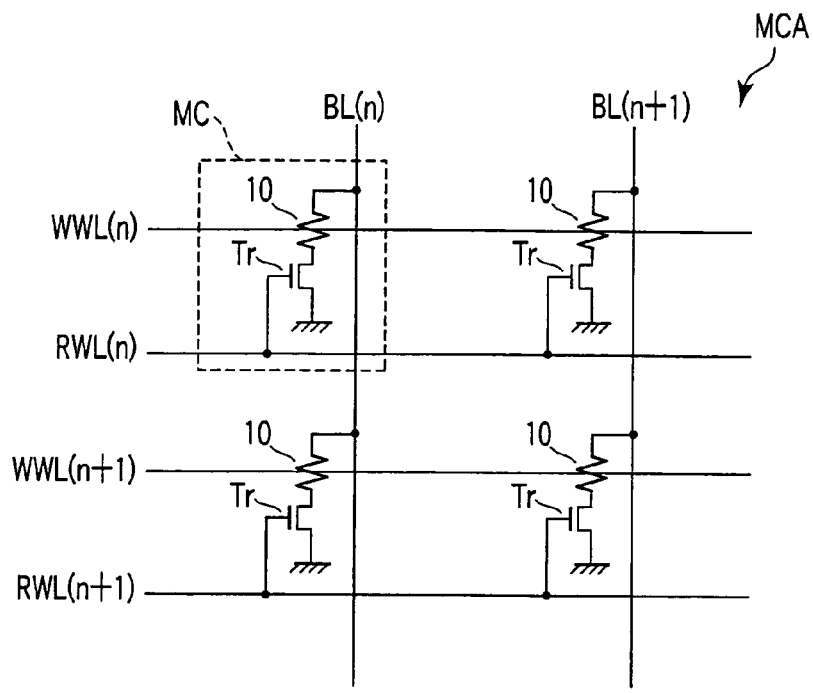
FIG. 37A is a circuit diagram showing the memory cell array of a magnetic random access memory according to the eleventh embodiment of the present invention, which includes memory cells having a select transistor structure.
Figure 37B:
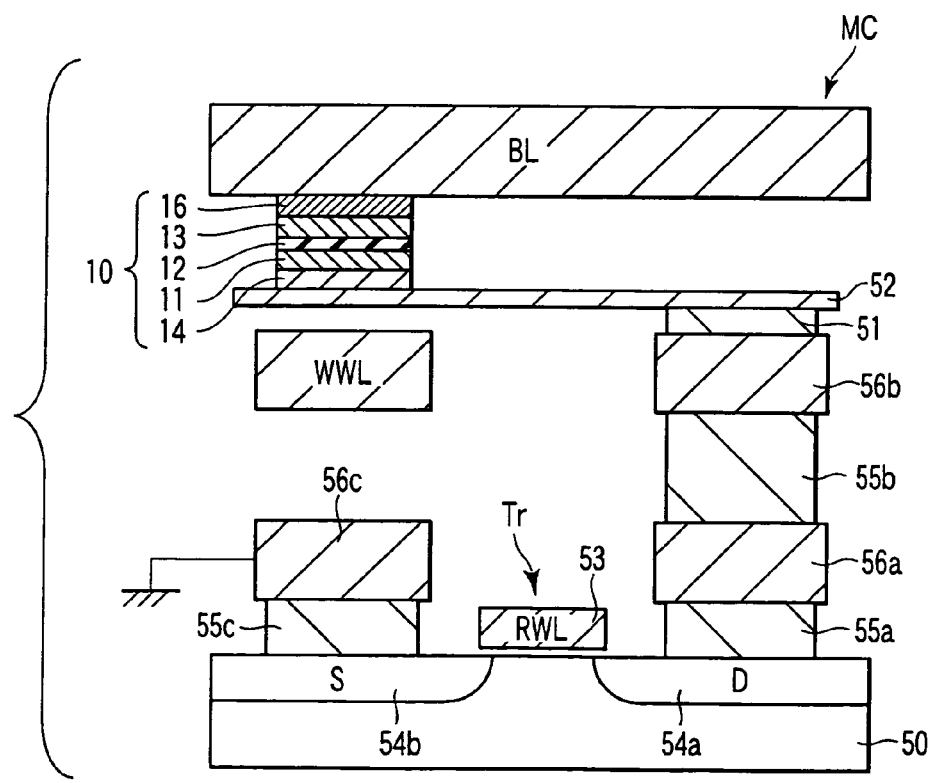
FIG. 37B is a sectional view showing one memory cell having a select transistor structure in the magnetic random access memory according to the eleventh embodiment of the present invention.

FIGS. 37A and 37B are a circuit diagram and sectional view, respectively, showing a magnetic random access memory having a select transistor structure according to the eleventh embodiment of the present invention. A so-called select transistor cell will be described below. The select transistor structure can be applied to a cell of the magnetic random access memories according to, e.g., the seventh to tenth embodiments.

As shown in FIGS. 37A and 37B, one cell MC having a select transistor structure includes one MTJ element 10, transistor (e.g., MOS transistor) Tr connected to the MTJ element 10, bit line BL, and write word line WWL. The memory cell array MCA is formed by laying out a plurality of memory cells MC in an array.

More specifically, one terminal of the MTJ element 10 is connected to one end (drain diffusion layer 54a) of the current path of the transistor Tr through the lower electrode wiring 52, contacts 51, 55a, and 55b, and wirings 56a and 56b. The other terminal of the MTJ element 10 is connected to the bit line BL. The write word line WWL electrically disconnected from the MTJ element 10 is arranged under the MTJ element 10. The other end (source diffusion layer 54b) of the current path of the transistor Tr is connected to, e.g., ground through a contact 55c and wiring 56c. A gate electrode 53 of the transistor Tr functions as the read word line RWL.

In the select transistor memory cell MC, the data write and read are executed in almost the same way as in the cross-point cell. In the read, the transistor Tr is used as a read switching element. More specifically, in the read, the bit line BL and read word line RWL corresponding to the selected MTJ element 10 are selected to turn on the transistor Tr, and the resistance of the MTJ element 10 is read from the transistor Tr flowing to the MTJ element 10.

The read switching element is not limited to the transistor Tr. A rectifying element (e.g., a p-n junction diode or Schottky barrier diode) can be used.

(D) Yoke Structure

Figure 38:
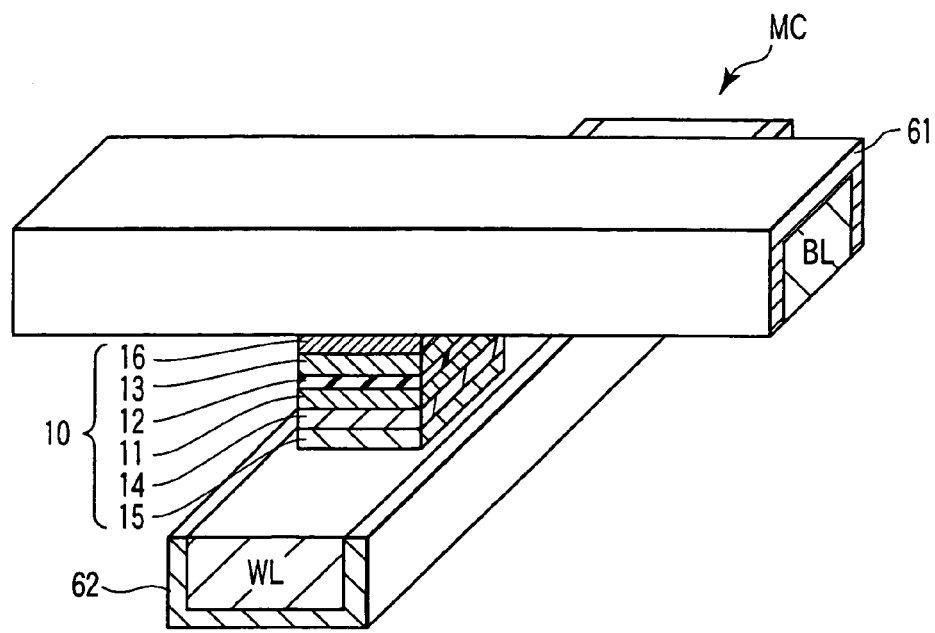
FIG. 38 is a perspective view showing a yoke structure in a conventional wiring structure in which a linear bit line and word line are laid out perpendicularly to each other.
Figure 39:
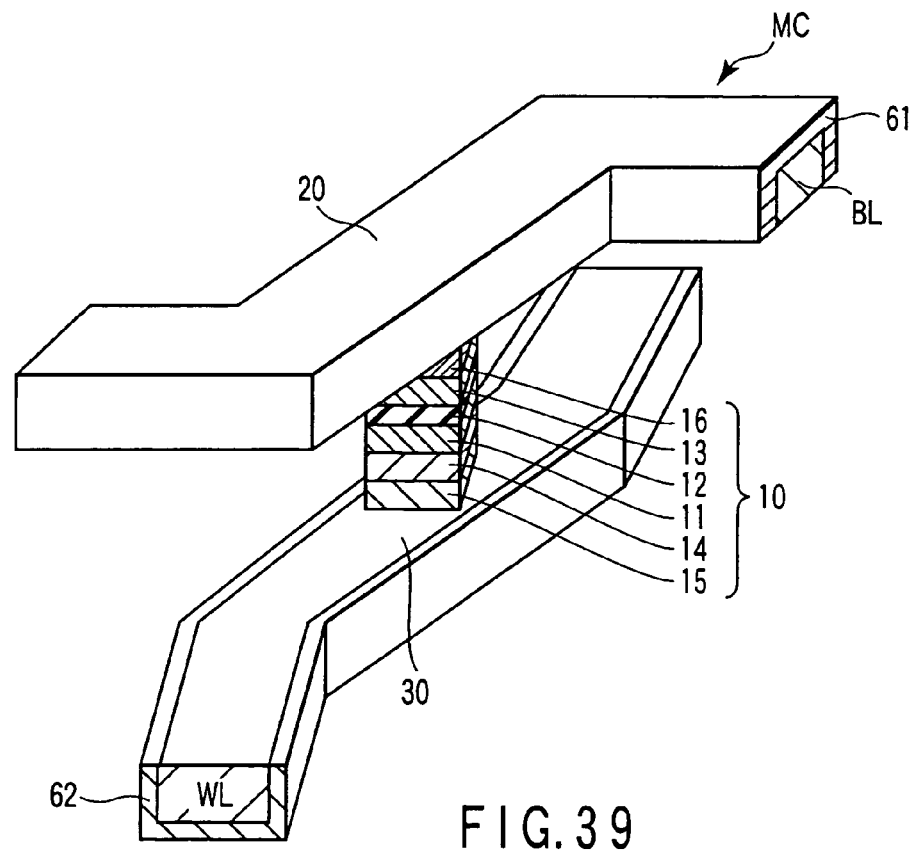
FIG. 39 is a perspective view showing a memory cell having a yoke structure in the magnetic random access memory according to the eleventh embodiment of the present invention.

FIG. 38 is a perspective view of a yoke structure in a conventional wiring structure in which a linear bit line and word line are laid out perpendicularly to each other. FIG. 39 is a perspective view of a memory cell having a yoke structure in the magnetic random access memory according to the eleventh embodiment of the present invention. The so-called yoke cell will be described below. The yoke structure can be applied to a cell of the magnetic random access memories according to the embodiments.

As shown in FIGS. 38 and 39, in the cell MC having a yoke structure, a yoke layer 61 made of a magnetic material is formed on the side and upper surfaces of the bit line BL. A yoke layer 62 made of a magnetic material is formed on the side and lower surfaces of the word line WL. Hence, the bit line BL and word line WL are surrounded by the yoke layers 61 and 62 except the surfaces opposing the MTJ element 10.

In the memory cell MC having the yoke structure, the magnetic fields generated from the write currents flowing to the bit line BL and word line WL can more efficiently be applied to the MTJ element 10 in the data write.

As shown in FIG. 39, when the yoke structure is applied to the write wirings, the semi-selected field can be reduced in the semi-selected state, as will be described below. In the write operation, in an unselected cell connected to the same bit line BL or word line WL as that of the selected cell as a write target, one of the write field by the word line WL and the write field by the bit line BL is applied. Conventionally, a write error caused by the semi-selected disturbance poses a problem. In the structure shown in FIG. 39 of this embodiment, however, in the memory cell portion, an oblique running portion 20 of the bit line BL and an oblique running portion 30 of the word line WL run in the same direction. For this reason, as shown in FIGS. 40B and 40C, most of the semi-selected field by the bit line field or word line field flows to the yoke layer of the other wiring, i.e., the soft magnetic material portion. Since the semi-selected field applied to the MTJ element 10 is much smaller than before, the disturbance by the semi-selected field can be considerably reduced.

In the above example, the yoke structure (D) is applied to the cross-point cell (A). The yoke structure (D) can also be applied to the divided cross-point cell (B) or select transistor cell (C).

Twelfth Embodiment

In the twelfth embodiment, an MTJ element having a so-called cross planar shape will be described (Jpn. Pat. Appln. KOKAI Publication No. 2004-128067).

FIG. 41 is a plan view showing the layout of a memory cell of a magnetic random access memory according to the twelfth embodiment of the present invention. The memory cell layout of an MTJ element having a so-called cross shape will be described below.

As shown in FIG. 41, an MTJ element 10 has a so-called cross planar shape. More specifically, the MTJ element 10 includes a main body portion 10a which runs in the Y direction, and projecting portions 10b and 10c which project in the X direction from, e.g., near the centers of the two side surfaces of the main body portion 10a. In other words, an X-direction width W near the center of the planar shape of the MTJ element 10 is larger than an X-direction width W' at the end.

All the corners of the cross-shaped MTJ element 10 can be angular, as shown in FIG. 41, or round. Of the fixed layer 11, nonmagnetic layer 12, and recording layer 13 of the MTJ element 10, the recording layer may have a cross planar shape, and the fixed layer and nonmagnetic layer may have a rectangular planar shape.

According to the twelfth embodiment, the same effect as in the first embodiment can be obtained. In the twelfth embodiment, since the MTJ element 10 has a so-called cross shape, the switching field can be reduced. Hence, the write current can further be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first write wiring which has a first running portion, a second running portion, a third running portion, a first oblique running portion, and a second oblique running portion, the first running portion running in a first direction, the second running portion running in the first direction, the third running portion running on substantially a same line as the first running portion, the first oblique running portion running in a first oblique direction with respect to the first direction, the second oblique running portion running in a second oblique direction different from the first oblique direction, the first oblique running portion having one end connected to the first running portion and the other end connected to one end of the second running portion, and the second oblique running portion having one end connected to the other end of the second running portion and the other end connected to the third running portion;
a second write wiring which has a fourth running portion, a fifth running portion, a sixth running portion, a third oblique running portion, and a fourth oblique running portion, the fourth running portion running in a second direction different from the first direction, the fifth running portion running in the second direction, the sixth running portion running on substantially a same line as the fourth running portion, the third oblique running portion running in a third oblique direction with respect to the second direction, the fourth oblique running portion running in a fourth oblique direction different from the third oblique direction, the third oblique running portion having one end connected to the fourth running portion and the other end connected to one end of the fifth running portion, and the fourth oblique running portion having one end connected to the other end of the fifth running portion and the other end connected to the sixth running portion; and
a memory element which is at least partially sandwiched between the first oblique running portion and the third oblique running portion.

2. The device according to claim 1, wherein
a plurality of the first write wirings are provided, and the first write wirings adjacent to each other are laid out to be line-symmetric, and
a plurality of the second write wirings are provided, and the second write wirings adjacent to each other are laid out to be line-symmetric.

3. The device according to claim 2, wherein
a relative angle between the first direction and the first oblique direction is equal to a relative angle between the first direction and the second oblique direction, and
a relative angle between the second direction and the third oblique direction is equal to a relative angle between the second direction and the fourth oblique direction.

4. The device according to claim 1, wherein the memory element includes at least one magnetoresistive element.

5. The device according to claim 4, wherein
a first relative angle between the first oblique direction and the third oblique direction is smaller than 90°, and
a second relative angle between the second oblique direction and the fourth oblique direction is smaller than 90°.

6. The device according to claim 5, wherein both the first relative angle and the second relative angle are 0°.

7. The device according to claim 6, wherein the first oblique running portion and the third oblique running portion overlap.

8. The device according to claim 4, wherein
the first oblique direction and the second oblique direction are tilted with respect to a direction of axis of hard magnetization of the magnetoresistive element by 45°, and
the third oblique direction and the fourth oblique direction are tilted with respect to a direction of axis of easy magnetization of the magnetoresistive element by 45°.

9. The device according to claim 4, wherein
the first oblique direction and the second oblique direction are tilted with respect to a direction of axis of hard magnetization of the magnetoresistive element by an angle of more than 0° and less than 45°, and
the third oblique direction and the fourth oblique direction are tilted with respect to a direction of axis of easy magnetization of the magnetoresistive element by an angle of more than 0° and less than 45°.

10. The device according to claim 4, wherein
the first oblique direction and the second oblique direction are tilted with respect to a direction of axis of hard magnetization of the magnetoresistive element by an angle of more than 45° and less than 90°, and
the third oblique direction and the fourth oblique direction are tilted with respect to a direction of axis of easy magnetization of the magnetoresistive element by an angle of more than 45° and less than 90°.

11. The device according to claim 4, wherein the first oblique running portion and the third oblique running portion cross.

12. The device according to claim 11, wherein
a relative angle between the first oblique direction and the third oblique direction is 90°, and
a relative angle between the second oblique direction and the fourth oblique direction is 90°.

13. The device according to claim 4, further comprising:
an electrode wiring which is arranged between the magnetoresistive element and one of the first write wiring and the second write wiring and electrically connected to the magnetoresistive element, a thickness of the electrode wiring being smaller than thicknesses of the first write wiring and the second write wiring.

14. The device according to claim 13, wherein a longitudinal direction of the electrode wiring is tilted with respect to both the first direction and the second direction.

15. The device according to claim 14, wherein the longitudinal direction of the electrode wiring is tilted with respect to one of the first direction and the second direction by 45°.

16. The device according to claim 4, wherein
in writing first data in the magnetoresistive element,
a first write current flows the first write wiring in the first direction,
a second write current flows the second write wiring in the second direction,
the first oblique direction of the first write current flowing in the first oblique running portion is substantially opposite to the third oblique direction of the second write current flowing in the third oblique running portion, and
the second oblique direction of the first write current flowing in the second oblique running portion is substantially opposite to the fourth oblique direction of the second write current flowing in the fourth oblique running portion, and
in writing second data in the magnetoresistive element,
a third write current flows the first write wiring in a direction opposite to the first direction,
a fourth write current flows the second write wiring in a direction opposite to the second direction,
the first oblique direction of the third write current flowing in the first oblique running portion is substantially opposite to the third oblique direction of the fourth write current flowing in the third oblique running portion, and
the second oblique direction of the third write current flowing in the second oblique running portion is substantially opposite to the fourth oblique direction of the fourth write current flowing in the fourth oblique running portion.

17. The device according to claim 16, wherein
the first write current and the third write current flow in opposite directions, and
the second write current and the fourth write current flow in opposite directions.

18. The device according to claim 17, wherein the first write current and the third write current have the same magnitude, or the second write current and the fourth write current have the same magnitude.

19. The device according to claim 17, wherein the first write current and the second write current have the same magnitude, or the third write current and the fourth write current have the same magnitude.

20. The device according to claim 17, wherein directions of a first magnetic field, a second magnetic field, a third magnetic field, and a fourth magnetic field generated by the first write current, the second write current, the third write current, and the fourth write current, respectively, are different from a direction of axis of hard magnetization and a direction of axis of easy magnetization of the magnetoresistive element.

* * * * *